(12) United States Patent
Latorre et al.

(10) Patent No.: US 11,489,541 B2
(45) Date of Patent: Nov. 1, 2022

(54) COMPRESSION TECHNIQUES FOR DATA STRUCTURES SUITABLE FOR ARTIFICIAL NEURAL NETWORKS

(71) Applicant: Nvidia Corporation, Santa Clara, CA (US)

(72) Inventors: Jorge Albericio Latorre, Santa Clara, CA (US); Ming Y. Siu, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 814 days.

(21) Appl. No.: 16/426,303

(22) Filed: May 30, 2019

(65) Prior Publication Data

US 2020/0373941 A1    Nov. 26, 2020

Related U.S. Application Data

(60) Provisional application No. 62/850,727, filed on May 21, 2019.

(51) Int. Cl.
*H03M 7/00* (2006.01)
*H03M 7/30* (2006.01)
*G06N 3/08* (2006.01)

(52) U.S. Cl.
CPC ............. *H03M 7/30* (2013.01); *G06N 3/08* (2013.01); *H03M 7/3059* (2013.01)

(58) Field of Classification Search
CPC ............................. H03M 7/30; H03M 7/3059
USPC ................. 341/50, 51, 106, 67, 65, 63, 102
See application file for complete search history.

(56) References Cited

U.S. PATENT DOCUMENTS

2013/0064370 A1* 3/2013 Gouge ............ H04N 21/26258
380/255
2020/0285618 A1    9/2020 Albericio Latorre et al.

* cited by examiner

*Primary Examiner* — Peguy Jean Pierre

(57) ABSTRACT

In artificial neural networks, and other similar applications, there is typically a large amount of data involved that is considered sparse data. Due to the large size of the data involved in such applications, it is helpful to compress the data to save bandwidth resources when transmitting the data and save memory resources when storing the data. Introduced herein is a compression technique that selects elements with significant values from data and restructures them into a structured sparse format. By generating metadata that enforces the structured sparse format and organizing the data according to the metadata, the introduced technique not only reduces the size of the data but also consistently places the data in a particular format. As such, hardware can be simplified and optimized to process the data much faster and much more efficiently than the conventional compression techniques that rely on a non-structured sparsity format.

28 Claims, 21 Drawing Sheets

COMPRESSION TECHNIQUES FOR DATA STRUCTURES SUITABLE FOR ARTIFICIAL NEURAL NETWORKS

CROSS-REFERENCE TO RELATED APPLICATION

This application claims the benefit of U.S. Provisional Application Ser. No. 62/850,727, filed on May 21, 2019, entitled "COMPRESSION TECHNIQUES FOR DATA STRUCTURES SUITABLE FOR ARTIFICIAL NEURAL NETWORKS," commonly assigned with this application and incorporated herein by reference in its entirety.

TECHNICAL FIELD

The present invention relates to data compression, and more particularly to the compression of sparse data structures.

BACKGROUND

Artificial neural networks (ANNs) are computing systems that are inspired by biological neural networks. ANNs provide a framework for many different machine learning algorithms to work together and process complex data inputs. ANNs have been used on a variety of tasks, including computer vision, speech and image recognition, machine translation, social network filtering, playing video games, and medical diagnosis.

SUMMARY

A first aspect provides a method for compressing data, comprising: generating metadata from an N element data structure, the generating including: selecting M elements from the N element data structure, wherein N is greater than M; determining positions of the M elements within the N element data structure; and storing the positions of the M elements as the metadata; and compressing the N element data structure to an M element data structure according to the metadata, the compressing including: gathering values of the M elements from the N element data structure according to the positions; and storing the values of the M elements in the M element data structure.

A second aspect provides system for compressing data comprising: a memory; and at least one processor communicatively coupled to the memory. The at least one processor is configured to: generate metadata from an N element data structure by: selecting M elements from the N element data structure, wherein N is greater than M; determining positions of the M elements within the N element data structure; and storing the positions of the M elements as the metadata; and compress the N element data structure to an M element data structure according to the metadata by: gathering values of the M elements from the N element data structure according to the positions; and storing the values of the M elements in the M element data structure.

BRIEF DESCRIPTION

Reference is now made to the following descriptions taken in conjunction with the accompanying drawings, in which.

DETAILED DESCRIPTION

In ANNs, and other similar applications, there is typically a large amount of data involved that is considered sparse data, or in other words, data that includes numerous zeros or near-zero values. Due to the large size of the data involved in such applications, it is helpful to compress the data (e.g., reduce the data size) to save bandwidth resources when transmitting the data and save memory resources when storing the data.

Introduced herein is a compression technique that compresses data by restructuring the data to follow a structured sparsity. The introduced technique generates metadata identifying elements of the data that contain significant values of the data and comply with the structured sparsity, and restructures the data according to the metadata. The introduced technique thus not only reduces the size of the data but also consistently places the data in a particular sparsity format. As such, hardware can be simplified and optimized to process data, e.g., computed, transmitted and stored, much faster and much more efficiently than the conventional compression techniques that rely on a non-structured sparsity format, such as CSR (Compressed Sprase Row) or COO (Coordinate list). For example, using the data compressed from the disclosed technique allows training of deep learning models with a greater amount of data and hence achieves better accuracy at the same computational cost as using a different compression technique.

Figure 1:
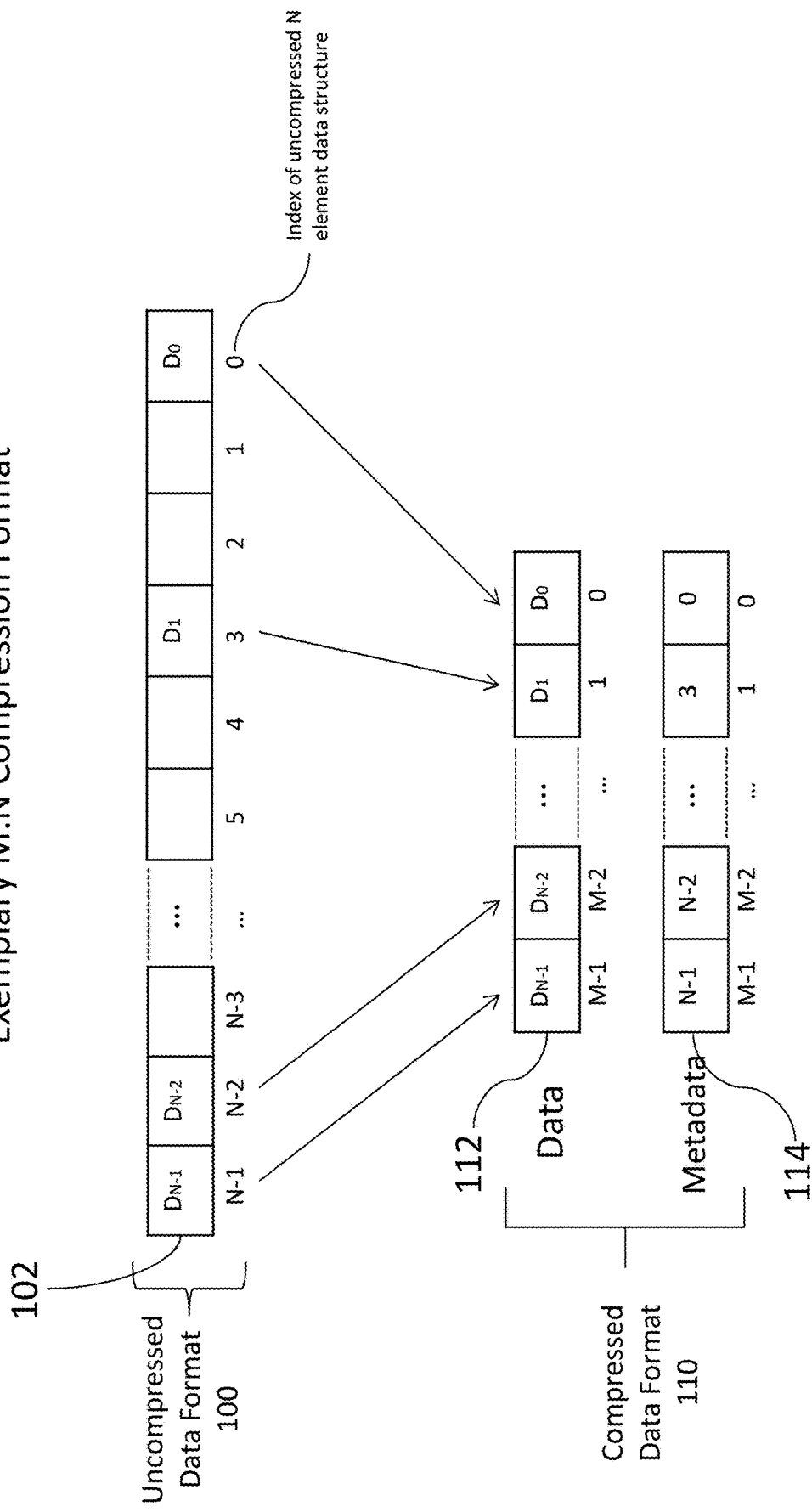
FIG. 1 is an illustration of an exemplary M:N compression format according to one or more aspects of the disclosure.

FIG. 1 illustrates an exemplary M:N compression format. Input data (data to be compressed) in an uncompressed data format 100 includes N elements in an N element data structure 102, and output data (compressed data) in a compressed data format 110 includes M element in an M element data structure 112 and metadata 114, where M<N. N elements in the N element data structure 102 are compressed into M element in the M element data structure 112 according to the metadata 114. The metadata 114 indicates for each element DN−1, . . . , D1, D0 in the M element data structure 112 the location (e.g., N−1, N−2, 3, 1) in the N element data structure 102 from where the corresponding element is to be copied. The compression format shown in FIG. 1 is referred to has having a compression ratio of M to N ("M:N"). Each element, e.g., DN−1, . . . , D1, D0 in the M and N element data structures 102 and 112 represents a numeric value, which may be in any number of bits (e.g., 4-bit ("nibble"), 8-bit ("byte"), 16-bit ("half"), 32-bit ("word"), 64-bit ("double"), etc.) encoded in an integer, floating point, fixed, logarithmic, or any other numeric format for encoding numeric values on a computer.

Figure 2:
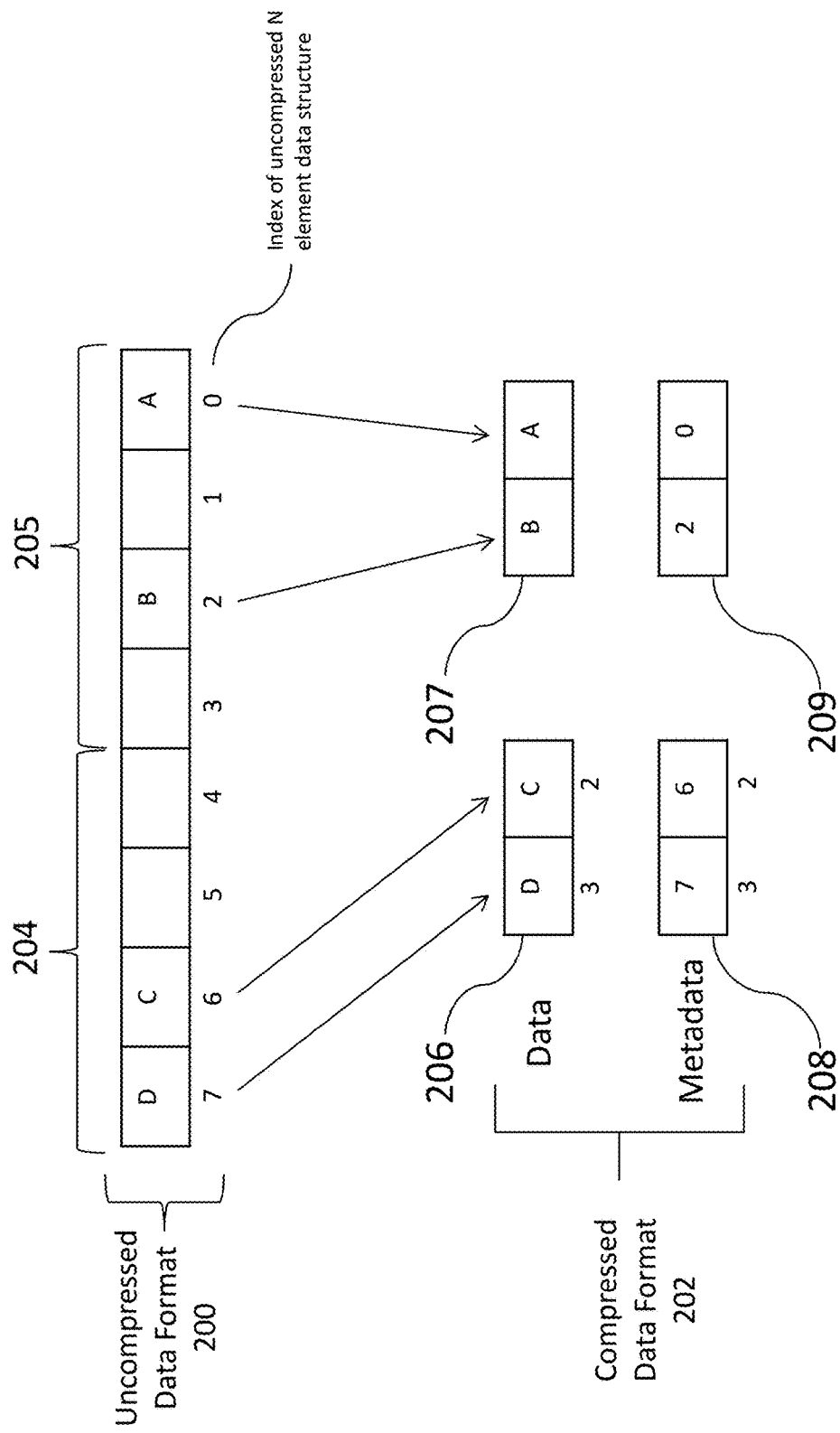
FIG. 2 is an illustration of an exemplary 2:4 compression format according to one or more aspects of the disclosure.

FIG. 2 illustrates an exemplary 2:4 compression format 200. In the illustrated example, 8 elements in uncompressed format 200, which are in two 4 element data structures 204 and 205, are compressed into 4 elements in a compressed data format 202, which includes two 2 element data structures 206 and 207 holding numeric values of the 4 elements, and two metadata 208 and 209 holding positions of the 4 elements. As such, N is 4, and M is 2 in the illustrated example.

In the illustrated example, elements D and C from the first 4 element data structure 204 are selected and copied into the first 2 element data structure 206, and elements B and A from the second 4 element data structure 205 are selected and copied into the second 2 element data structure 207. The first metadata 208 indicates positions (e.g., an index) of the selected elements in the first 4 element data structure 204, and the second metadata 209 indicates positions of the selected elements in the second 4 element data structure 205.

A number of elements to be selected and a basis for selecting those elements for compression are specified in the executed compression instruction. To facilitate the correspondences among the 4 and 2 element data structures and their metadata, sizes, locations (e.g., registers) and offsets for the 4 and 2 data structures and their metadata are also specified in the compression instruction.

The compression instruction may be divided into two separate instructions, one for generating metadata and the other for gathering data or combined into a single super-instruction. The compression instruction may also be executed to operate on a single set of data, e.g., either the first 4 element data structure 204 or the second 4 element data structure 205, or to operate on multiple sets of data, e.g., both the first 4 element data structure 204 and the second 4 element data structure 205.

As the illustrated compression is a lossy type compression that logically operates on one or more sets of a relatively small number of elements (e.g., 4 elements), it can apply to data that is much larger and also much smaller (e.g., in a number of elements) than the data shown in FIG. 2. Moreover, as the illustrated compression follows the M:N compression ratio and hence retains M elements for every N elements, it consistently maintains the structured sparsity throughout the compressed data format.

Figure 3:
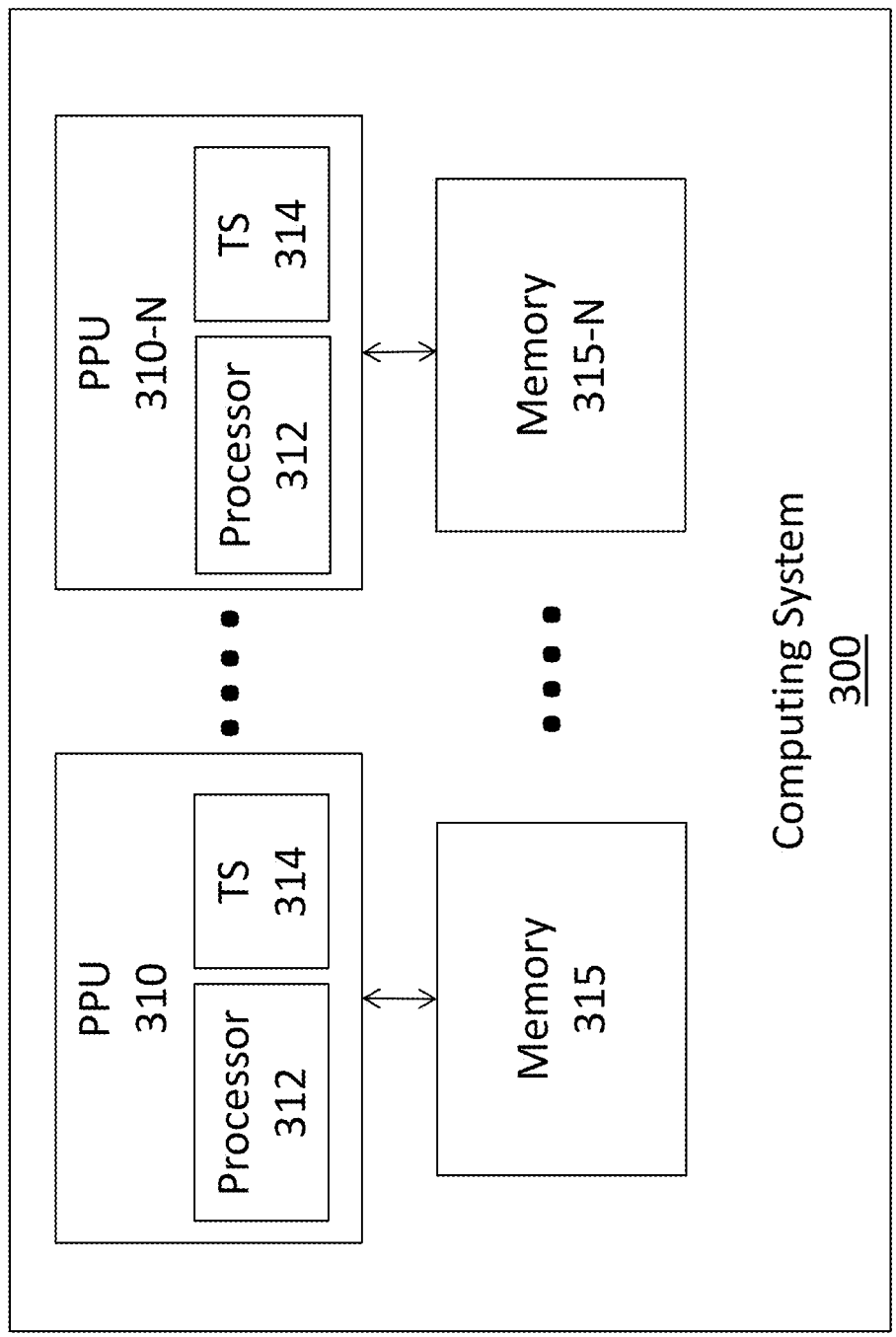
FIG. 3 is a block diagram of an embodiment of a computing system that perform data compression according to one or more aspects of the disclosure.

FIG. 3 illustrates a block diagram of an embodiment of a computing system 300 configured to perform compression operations on data according to the principles of the disclosure. In the illustrated embodiment, the system 300 includes parallel processing units (PPUs) 310 to 310-N (hereinafter PPUs 310s) and their respective memories 315 to 315-N (hereinafter memories 315s). The PPUs 310s and the memories 315s are communicatively coupled to one another using conventional means, such as high-speed interconnects.

Each of the PPUs 310s includes one or more processors 312 that are configured to perform various operations, such as compression, decompression and transposition of data. The data can be, for example, a vector, tensor or matrix. Each processor 312 is multi-threaded and configured to concurrently execute a plurality of threads (e.g., 32 threads) from a particular group of threads. In an embodiment, the processor 312 implements a SIMD (Single-Instruction, Multiple-Data) architecture where each thread in a group of threads (e.g., a warp) is configured to process a different set of data based on the same set of instructions. In another embodiment, the processor 312 implements a SIMT (Single-Instruction, Multiple Thread) architecture where each thread in a group of threads is configured to process a different set of data based on the same set of instructions where each thread may execute different subsets of the same set of instructions.

Each of the PPUs 310s also includes a temporary storage (TS) 314, such as a register file or a memory, that is configured to stage or temporarily store data between the processor 312 and the memory 315 for the operations. The PPUs 310s can be a different type of general or special processing unit such as a central processing unit (CPU), a graphics processing unit (GPU), a field-programmable gate array (FPGA), and an application-specific integrated circuit (ASIC).

Each of the memories 315s is configured to store data needed to perform various operations. Each of the memories 315s may store actual values of the data involved in the operations and a series of instructions that can cause the PPUs 310s to perform the operations. In an embodiment, the memories 315s may comprise a number of dynamic random access memory (DRAM) devices and/or random access memory (RAM) devices.

Figure 4:
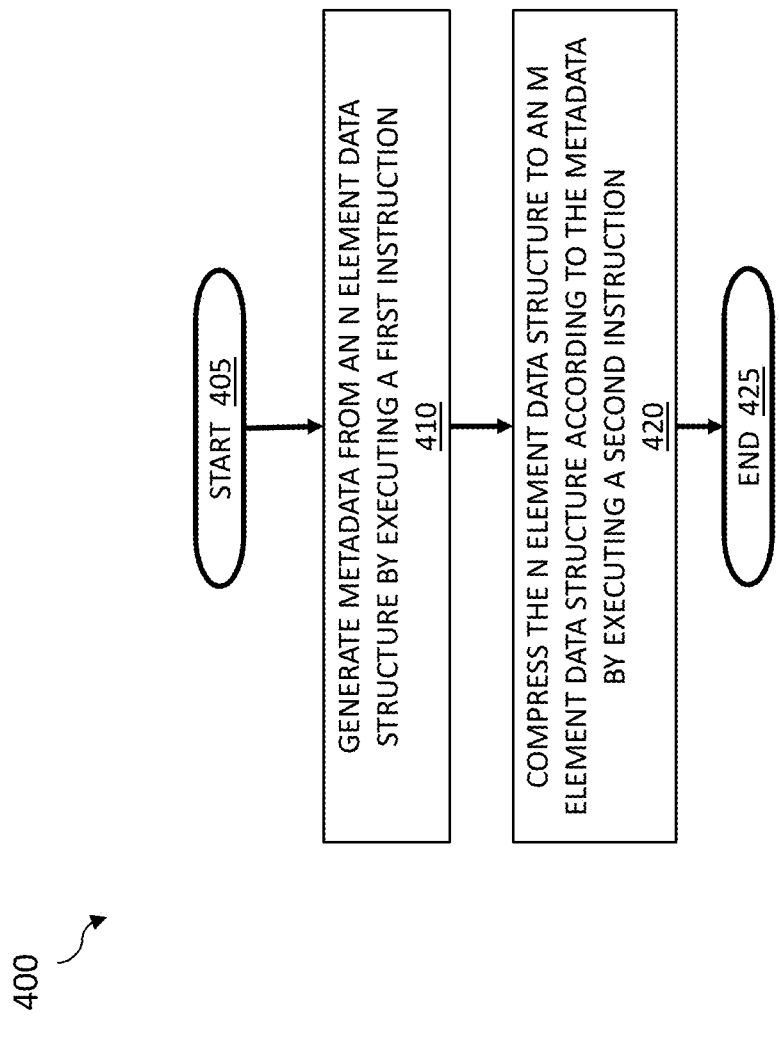
FIG. 4 is a flow diagram of an embodiment of a method for compressing data according to one or more aspects of the disclosure.

FIG. 4 illustrates a flow diagram of an embodiment of a method 400 for compressing data carried out according to the principles of the disclosure. The method 400, or at least a portion thereof, may be performed by a computing system, such as the computing system 300 in FIG. 3. The method 400 starts at step 405.

At Step 410, metadata is generated from an N element data structure to be compressed by executing a first instruction. N is a positive integer that indicates a number of elements in a data structure that is being compressed. In the illustrated embodiment, the N element data structure represents an N element vector. The N element data structure may also represent an N element tensor or N element matrix. The N element data structure may be one of many N-element data structures in a source storage. In the illustrated embodiment, the first instruction is a metadata-generating instruction, which is referred as a GENMETADATA instruction. In one embodiment, the first instruction is an operation of a "super-instruction" that performs both metadata-generation and data compression operations. An example format of a GENMETADATA instruction is provided below.

As a first sub-step of Step 410, the N element data structure is received as an input of the first instruction. The N element data structure is pulled from a source register or memory location, which is indicated in the first instruction. The source register/memory location may correspond to a particular register file or memory location in a temporary storage, such as the TS 314 in FIG. 3.

As a second sub-step, Step 410 selects M elements from the N element data structure using a function in the first instruction. M is a positive integer that is smaller than N. The function may be, for example, a MAX function that compares values of all elements in an N element data structure and selects M number of elements with greater values, a MAXABS function that compares magnitudes of all elements in an N element data structure and selects M number of elements with greater magnitudes, a MIN function that compares values of all elements in an N element data structure and selects M number of elements with lesser values, or a MINABS function that compares magnitudes of all elements in an N element data structure and selects M number of elements with lesser magnitudes. It is understood that other functions, such as a function that selects a certain number of elements having values in a certain range, may also be used.

As a third sub-step of Step 410, positions of the selected M elements within the N element data structure are determined. When the N element data structure is one of multiple N element data structures in a larger data structure, the starting position of the N element data structure within the larger data structure is determined using a group index indicated in the first instruction, and is used as an offset to the positions of the M elements within the N element data structure.

As a fourth sub-step of Step 410, the positions of the M elements are stored in a destination register/memory location as the metadata. The position at which the metadata is stored within the destination register, e.g., the starting position (offset) of the metadata within the destination register, is determined using a metadata index indicated in the first instruction. The destination register may correspond to a particular register file or memory location in a temporary storage, such as the TS 314 in FIG. 3. It is understood that the positions of the elements that are not selected in the second sub-step of Step 410 are not determined and hence are not stored in the third and fourth sub-steps.

At Step 420, the N element data structure is compressed into an M element data structure according to the metadata, by executing a second instruction. In the illustrated embodiment, the second instruction is a data-compression instruction, which is different from the first instruction. The data-compression instruction is referred as a GATHER instruction. In one embodiment, the second instruction is an operation of a "super-instruction" that performs both metadata-generation and data compression operations. An example format of a GATHER instruction is provided below. As a first sub-step of Step 420, the metadata generated at Step 410 and the N element data structure are received as an input of the second instruction. The N element data structure and the metadata are accessed from their respective source registers/memory locations. The source registers may correspond to particular register files or memory locations in a temporary storage, such as the TS 314 in FIG. 3.

As a second sub-step of Step 420, values of the selected elements, i.e. the M elements, are gathered from the N element data structure according to the positions indicated in the metadata. When the N element data structure is one of multiple N element data structures in a larger data structure, the starting position of the N element data structure within the larger data structure is determined using a group index and is used as an offset to the positions of the M elements. The starting position of the metadata within the source register is determined using a metadata index. The group index and the metadata index are included/indicated in the second instruction.

As a third sub-step of Step 420, the gathered values of the M elements are stored in an M element structure. In the illustrated embodiment, the M element data structure represents an M element vector. In other embodiments, the M element data structure may represent an M element tensor or M element matrix. The M element structure is located in a destination register/memory location, which is indicated in the second instruction. The destination register may correspond to a particular register file or memory location in a temporary storage, such as the TS 314 in FIG. 3. At the end of Step 420, the method 400 has achieved a structured sparsity format of M:N. The method 400 ends at Step 425.

The method 400 can be performed by a single thread of execution. Alternatively, the method 400 can be performed by a plurality of threads. In an embodiment, a single thread compresses all of the input N element data structures. In another embodiment, each of a pair of threads compresses half of the input N element data structures. In yet another embodiment, each of a quad of threads compresses a quarter of the input N element data structures. While the present description, both above and below, describes threads of execution (e.g., on a GPU), it should be noted that lanes of execution (e.g., on each execution path of a single instruction multiple data (SIMD) CPU) may similarly be utilized in place or in addition to threads.

The method 400 can be repeated/cascaded to achieve a higher ratio of compression or sparsity. For example, when N is 4 and M is 2, the method 400 can be repeated three times to achieve a compression ratio of 2:8. The method 400 can be executed two times to generate two interim M element data structures from two N element structures, and then executed a third time to generate a final M element data structure from a combination of the two interim M element structures.

An example format for an example of a GENMETADATA instruction is shown below:
GENMETADATA.func.selectN.fmi.idxsize.num{.SEQ}Rd, Ra, Rb, Rc, #VecIdxU06, #MDidxU04
where:
.func: a function that controls how values of elements in an N element data structure are compared to one another for selection (as described above, .func can be, for example, MAX, ABSMAX, MIN, ABSMIN, etc.);
.selectN: a number of elements to be selected using .func such as 1 or 2;
.fmt: a format of elements in Ra and Rb, including integer formats such as signed 2, 4, 8, 16 and 32 bit integer (.S2, .S4, .S8, .S16, .S32) and unsigned 2, 4, 8, 16 and 32 bit integer (.U2, .U4, .U8, .U16, .U32) and non-integer formats such as IEEE half precision (16 bits) or single (32 bits) precision floating point (.FP16, .FP32), truncated versions of FP16 and FP32 (E8M7, E8M10), LNS (log number system), POSITs (a proposed new dynamical scaled numeric format), other 8-bit floating point like formats, and Block-exponent formats;
.idxsize: a size of metadata index such as 2-bit, 4-bit, or 8 bit (.U2, .U4, .U8)
.num: a number of input N element data structures in in the source storage such as 1 data structure, 2 data structures, or 4 data structures (.1G, .2G, .4G);
.SEQ: optional sequential indexing: when operating on more than one N element data structure, all N element data structures are sequentially indexed as though they are part of a single, larger data structure instead of repeating the same N indices for each N element data structure;
Rd: destination register or memory location;
Ra: first source register or memory location containing all or a portion of an N element data structure
Rb: second source register or memory location containing all or a portion of an N element data structure;
Rc: optional source register or memory location; when GENMETADATA specifies .idxsize and .num such that that not all bits of Rd would be written, the contents of Rc flow through to otherwise unwritten bits of Rd. Rz (e.g., a register or memory location having zero value) is used as a placeholder when no optional source storage is used;
VecIdxU06: group index; a 6 bit immediate indicating the (starting) position of an N element data structure within a larger data structure, e.g., when the N element data structure is one of multiple N element data structures in the larger data structure;

MDidxU04: metadata index; a 4-bit immediate that determines the offset in bits where metadata is written to Rd.

FIGS. 5-9 provide examples of a GENMETADATA instruction using the format described above.

Figure 5:
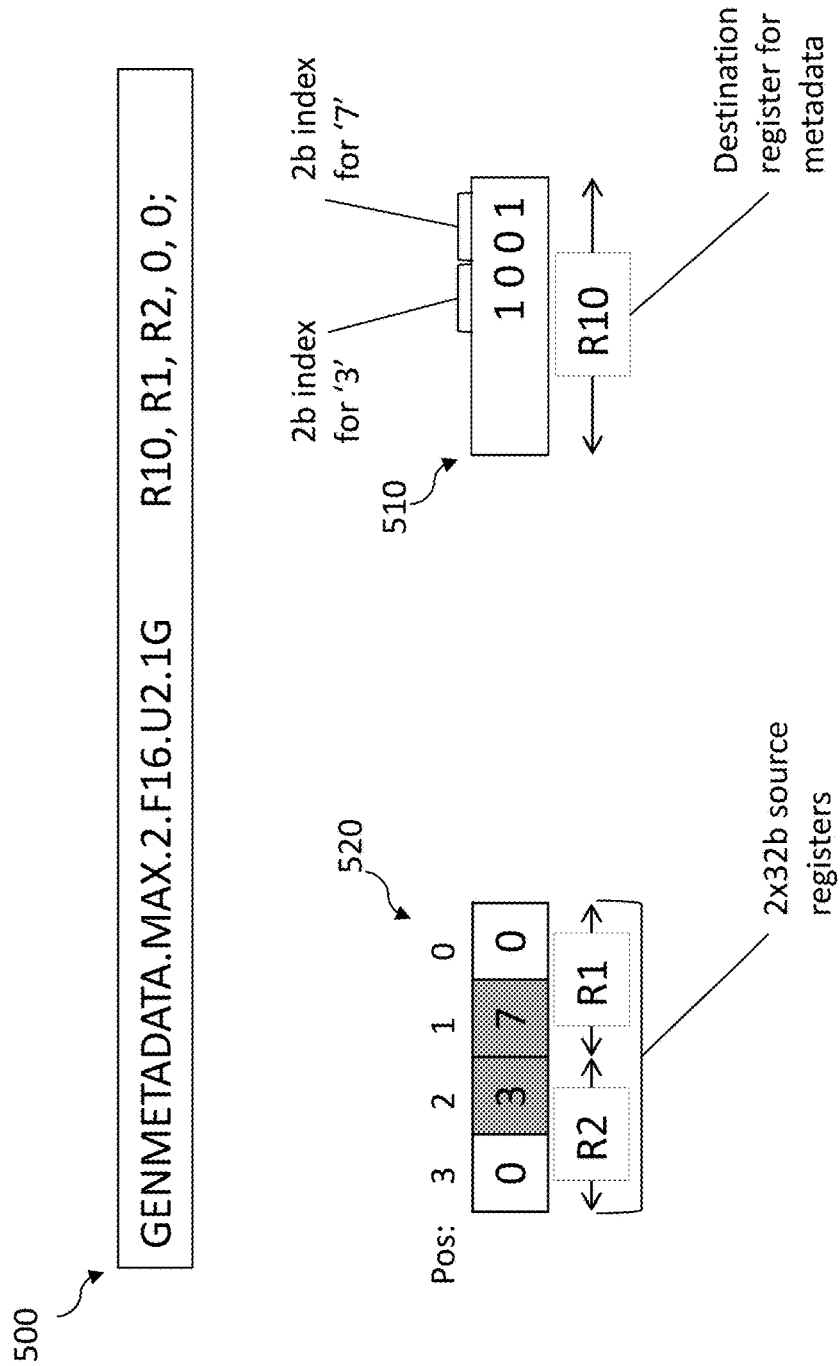
FIGS. 5-9 are examples of a GENMETADATA instruction that generates metadata according to one or more aspects of the disclosure.

FIG. 5 illustrates an example of GENMETADATA instruction 500 that generates metadata 510 from an N element data structure 520. In the illustrated example, N is 4 and M is 2, and the example generates the metadata 510 indicating positions of 2 elements within the 4 element data structure 520.

In the illustrated example, the 4 element data structure 520 is stored in the source registers R1 and R2 and the generated metadata 510 will be stored in the destination register R10. In the GENMETADATA instruction 500, ".1G" indicates that only one 4 element data structure is stored in the source registers, and ".F16" indicates that each element in the 4 element data structure 520 is 16 bits. As the size of each source location is limited to 32 bits in the illustrated example, each source register contains two elements. #VecIdx U06 value of 0 indicates that the starting position of the 4 element data structure 520 is '0'.

As indicated by MAX.2, the instruction 500 selects two elements with greater value, '3' and '7', from R1 and R2, which have positions of '2' and '1', respectively. Since the index size in the metadata 510 is 2 bits (as indicated by .U2), the positions of '2' gets written as 1 0 and the position of '1' gets written as 0 1 in the metadata 510. As #MDidxU04 is zero, the positions bits of the selected elements are written to the first 4 bits (2×2 bits) of the destination register R10.

Figure 6:
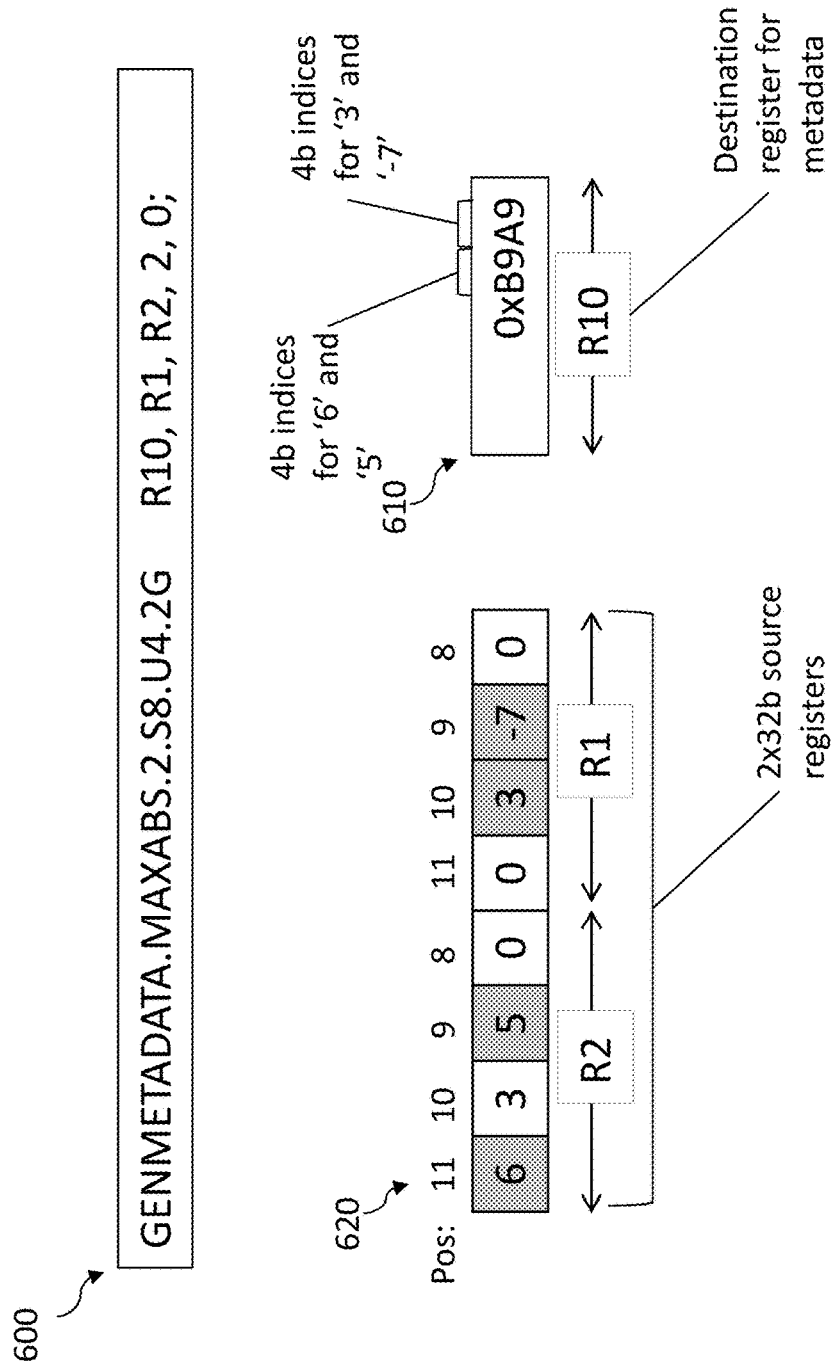

FIG. 6 illustrates another example of GENMETADATA instruction 600 that generates metadata 610 from an N element data structure 620. In the illustrated example, N is 4 and M is 2, and the example generates the metadata 610 indicating positions of 2 elements within the 4 element data structure 620.

In the illustrated example, as indicated by .2G, and R1 and R2, two 4 element input data structures (64 bits in total) are stored in two source register R1 and R2. As each element of the 4 element data structures 620 is 8 bits (as indicated by .S8), each source register contains four 8-bit elements. #VecIdx U06 value of 2 indicates that the starting position of the 4 element data structure 620 in each source register is '8'. The starting position can be calculated by multiplying the value of #VecIdx U06 with 4. As indicated by MAXABS.2, the instruction 600 selects two elements with greater magnitude from each of the input 4 element data structure 620. Elements having values '3' and '−7' are selected from R1 and elements having values '6' and '5' are selected from R2. As the starting position of the elements in each of the source locations is '8', the position of the elements having values of '6' and '5' in R2 are '11' and '9', respectively, and the position of the elements having values of '3' and '−7' in R1 are "10" and "9". Since the index size in the metadata is 4 bits (as indicated by .U4), the position '11' and '9' are written in hexadecimal format as 'B' and '9", and the position '10' and '9' are written as 'A' and '9' in the metadata 610. As no offset is specified, the positions are written to the first 16 bits (4×4 bits) of the destination register R10. It is understood that when the index size in the metadata is 8 bits (as indicated by .U8), the positions are written in hexadecimal format with the most significant 4 bits set to zero.

Figure 7:
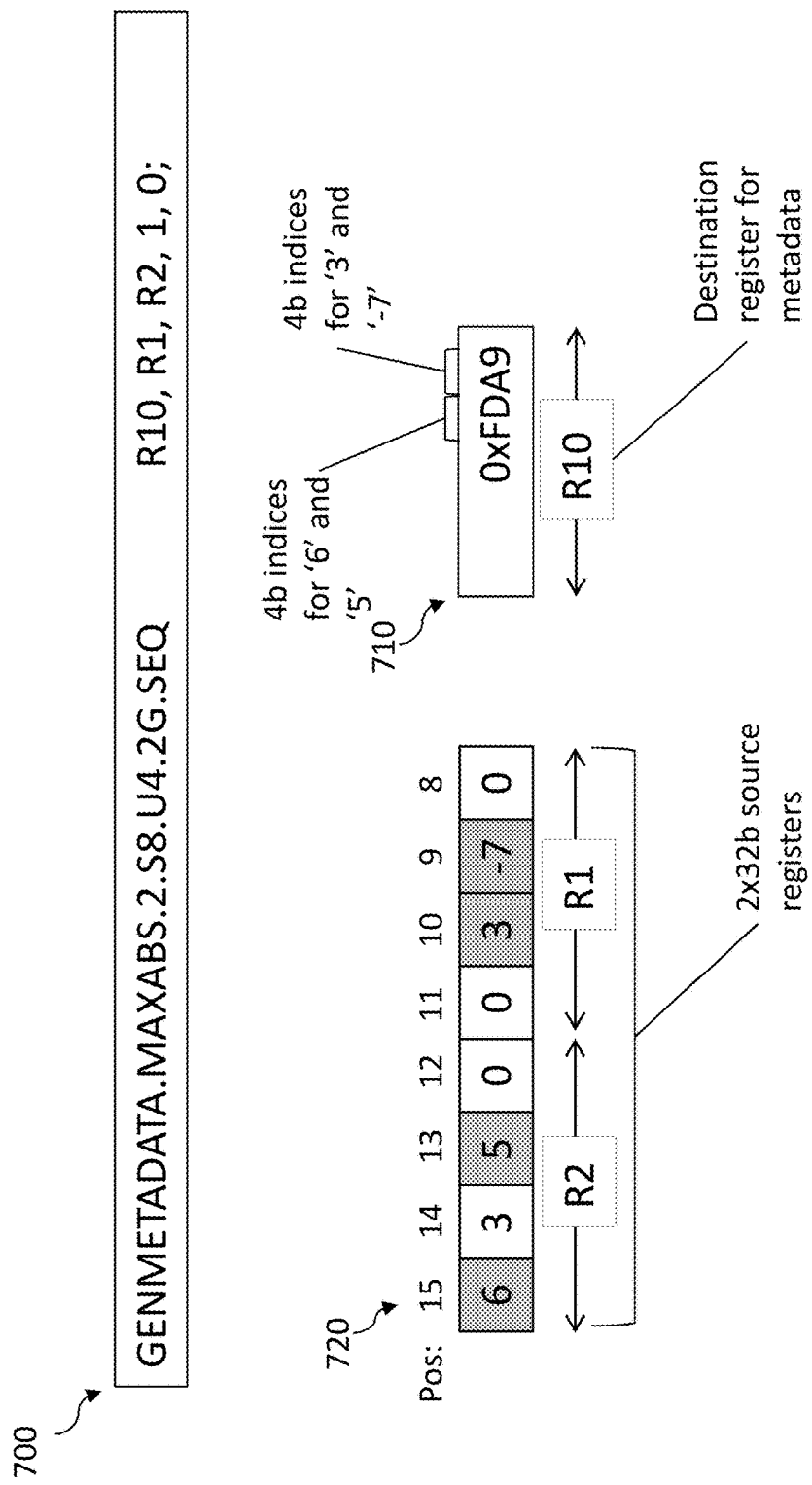

FIG. 7 illustrates yet another example of GENMETADATA instruction 700 that generates metadata 710 from an N element data structure 720. In the illustrated example, N is 4 and M is 2, and the example generates the metadata 710 indicating positions of 2 elements within the input 4 element data structure 720.

In the illustrated example, as indicated by .2G, and R1 and R2, two input 4 element data structures (64 bits in total) are stored in two source registers R1 and R2. As each element of the 4 element input data structures 720 is 8 bits (as indicated by .S8), each source register contains four 8-bit elements. #VecIdx U06 value of 1 indicates that each input data structure 720 should start at position 4 (1×4). The presence of .SEQ, however, indicates that the input data structures 720 in the source registers R1 and R2 are sequenced, and, instead of starting at position 4, the input data structures 720 starts at position 8 and goes up to bit 15. When .SEQ is set, the starting position of the elements in the source registers may be calculated by multiplying a value of #VecIdx U06 with 4 and a value of .num. As indicated by MAXBS.2, the instruction 700 selects two elements with greater magnitude from each 4 element data structure 720. Elements having values 3 and −7 are selected from R1 and elements having values 6 and 5 are selected from R2. As the starting position of the element in the source locations is 8, the position of the selected elements having values of '6' and '5' are '15' and '13', respectively, and positions of the selected elements having values of '3' and '−7' are '10' and '9'. Since the index size in the metadata is 4 bits (as indicated by .U4), the positions '11' and '9' are written in hexadecimal format as 'F' and 'D", and '10' and '9' are written as 'A' and '9' in the metadata 710. As #MDidxU04 is zero, the positions are written to the first 16 bits (4×4 bits) of the destination register R10.

Figure 8:
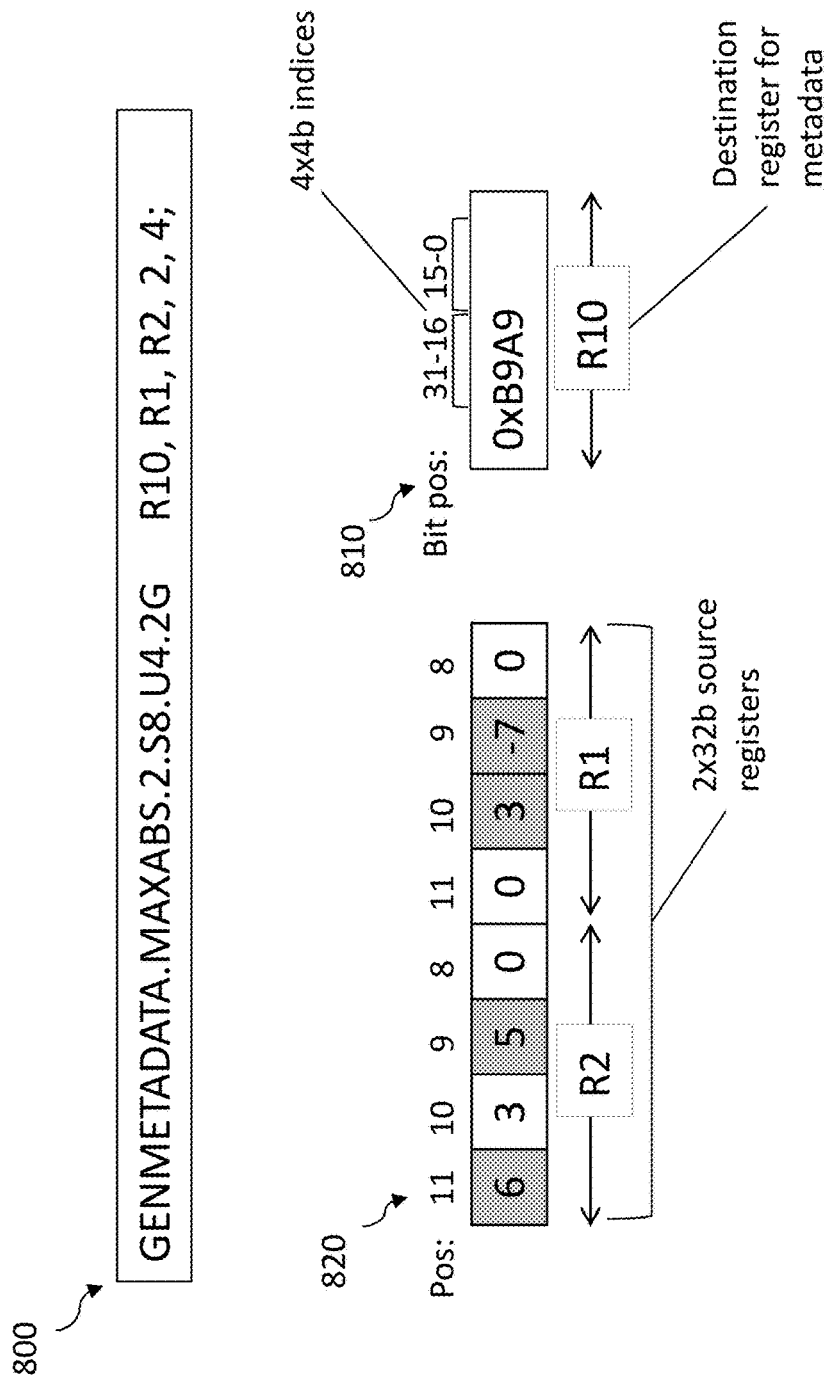

FIG. 8 illustrates yet another example of GENMETADATA instruction 800 that generates metadata 810 from an input N element data structure 820. In the illustrated example, N is 4 and M is 2, and the example generates the metadata 810 indicating positions of 2 elements within the input 4 element data structure 820.

In the illustrated example, as indicated by .2G, and R1 and R2, two 4 element data structures (64 bits in total) are stored in two source registers R1 and R2. As each element of the input data structure 820 is 8 bits (as indicated by .S8), each source registers R1, R2 contains four 8-bit elements. As #VecIdxU06 has a value of 2, and .SEQ is not present, the each input data structure 820 starts at position 8 (2×4) of each source register. As #MDidxU04 has a value of 4, the starting bit for the metadata 810 within the destination register is 16, which is calculated by multiplying a value of #MDidxU04 with a value of .idxsize.

As indicated by MAXABS.2, the example instruction 800 selects two elements with greater magnitude from each of the input data structures 820. As such, elements having values '3' and '−7' are selected from R1 and elements having values '6' and '5' are selected from R2. As the starting position of each input data structure 820 is 8, the positions of the selected elements having values of '6' and '5' in R2 are '11' and '9', respectively, and positions of the selected elements having values of '3' and '−7' in R1 are '10' and '9'. Since the index size in the metadata is 4 bits (as indicated by .U4), the positions '11' and '9' are written in hexadecimal format as 'B' and '9', and '10' and '9' are written as 'A' and '9' in the metadata 810. As the offset is 16, the positions are written in bits 16-31 of the destination register R10.

Figure 9:
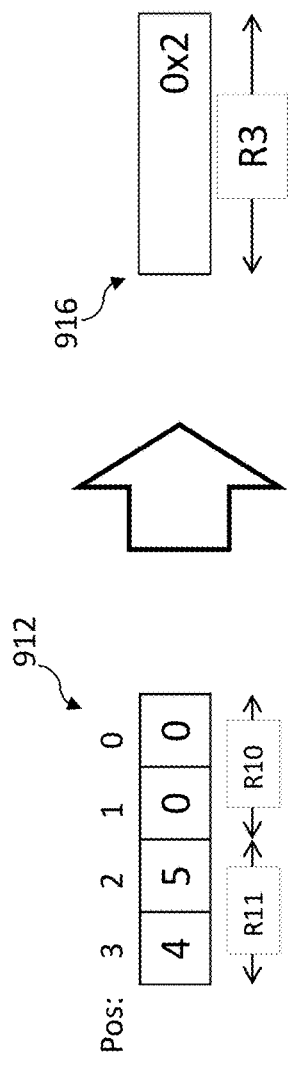
Figure 9:
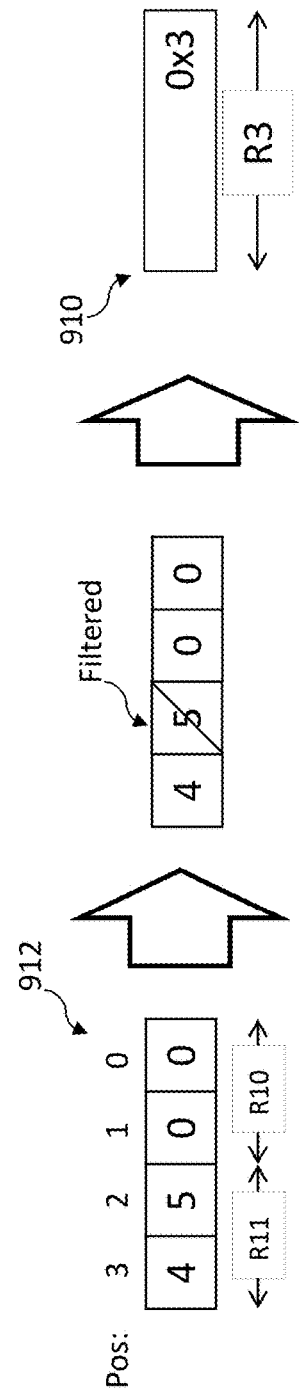

FIG. 9 illustrates an example of GENMETADATA instruction that generates metadata 910 from an input N element data structure 912. In the illustrated example, N is 4 and M is 1, and the example generates the metadata 910 indicating a position of 1 element within the input 4 element data structure 912. As indicated by .1G, and R10 and R11, one input 4 element data structure (64 bits in total) are stored in two source registers R10 and R11. As each element of the 4 element input data structures 912 is 16 bits (as indicated by .F16), each source register contains 2 16-bit elements.

In the illustrated example, the instruction selects and determines a position of one element for each pass (as indicated by .1 following MAX), and employs #PassU01 and #NibbleU03 instead of #VecIdxU06 and #MDidxU04, respectively. #PassU01 is a 1 bit immediate that indicate a pass number and the presence of filtering/masking (0 indicates the first pass and no filtering), and #NibbleU03 is a 3 bit immediate used to determine a position of the element to be used for filtering.

As indicated by 0 of #PassU01, the first instruction 914 selects one element with the greatest value ('5') and writes its position ('2') to the metadata 916 in the first pass. '0' for #nibbleU03 in the second instruction indicates that the value 2 at the position 0 in the source register R3 is the position of the element to be filtered from the source input data structure. As such, in the second pass, the instruction 918 first filters/masks the element with value '5' located at position 2 in the input data structure 912 Of the remaining elements, the second instruction 918 then selects an element with the greatest value '4' and writes its position ('3') to the metadata 910. '3' overwrites '2' in the metadata as no #MDidxU04 value is indicated. At the end of the second pass, the metadata 910 indicates the position of an element with the second greatest value. It is understood that the described filtering process can be modified, e.g., with a different function, and/or extended, e.g., with one or more additional passes, to filter out certain elements from an input data structure. It is also understood that by setting #MDidxU04 to keep the position value of previous pass, the described filtering process mimic 2:4 GENMETADATA instruction, which is more expensive in terms of the processing resources that executing 1:4 GENMETADATA twice.

An example format for an example of GATHER instruction is shown below.

GATHER.datasize.idxsize.num  Rd, Ra, Rb, Rc, #VecIdxU06, #MDidxU04, #DstByteU02, #SrcHalfU01
where:
.datasize: bit width of data elements in Ra, Rb and Rd, such as 16-bit, 8-bit, or 4-bit (.16, 18, .4);
.idxsize: a size of metadata index such as 2-bit, 4-bit, or 8 bit (.U2, .U4, .U8);
.num: a number of input N element data structures represented by Ra and Rb such as 1 data structure, 2 data structures, or 4 data structures (.1G, .2G, .4G);
Rd: destination register or memory location;
Ra: first source register or memory location containing all or a portion of an N element data structure;
Rb: second source register or memory location containing all or a portion of an N element data structure;
Rc: third source register or memory location containing metadata; #VecIdxU06: group index; 6 bit immediate indicating the (starting) position of an N element data structure within a larger data structure, e.g., when the N element data structure is one of multiple N element data structures in the larger data structure.
MDidxU04: metadata index; 4-bit immediate that determines the offset in bits where metadata is located within Rc;
DstByteU02: 2-bit immediate used to determine where in Rd to write the 16-bit or 8-bit word when total input data is 32 or 16 bits, respectively (1 group of int8, 2 groups of int4, or 1 group of int4). When the total input data is 32 bits, then this immediate must have a value that is a multiple of 2. When this immediate has a value that is a multiple of 2, Ra alone contains all the input data, the gathered data elements are either 16 or 8 bits, and only a portion of Rd is written with this data; the rest of Rd is written with the contents of Rb;
SrcHalfU01: 1-bit immediate used to determine whether to read from the lower or upper half of Ra when operating on a single group of int4 data elements.

FIGS. 10-14 provide examples of a GENMETADATA instruction using the format described above.

Figure 10:
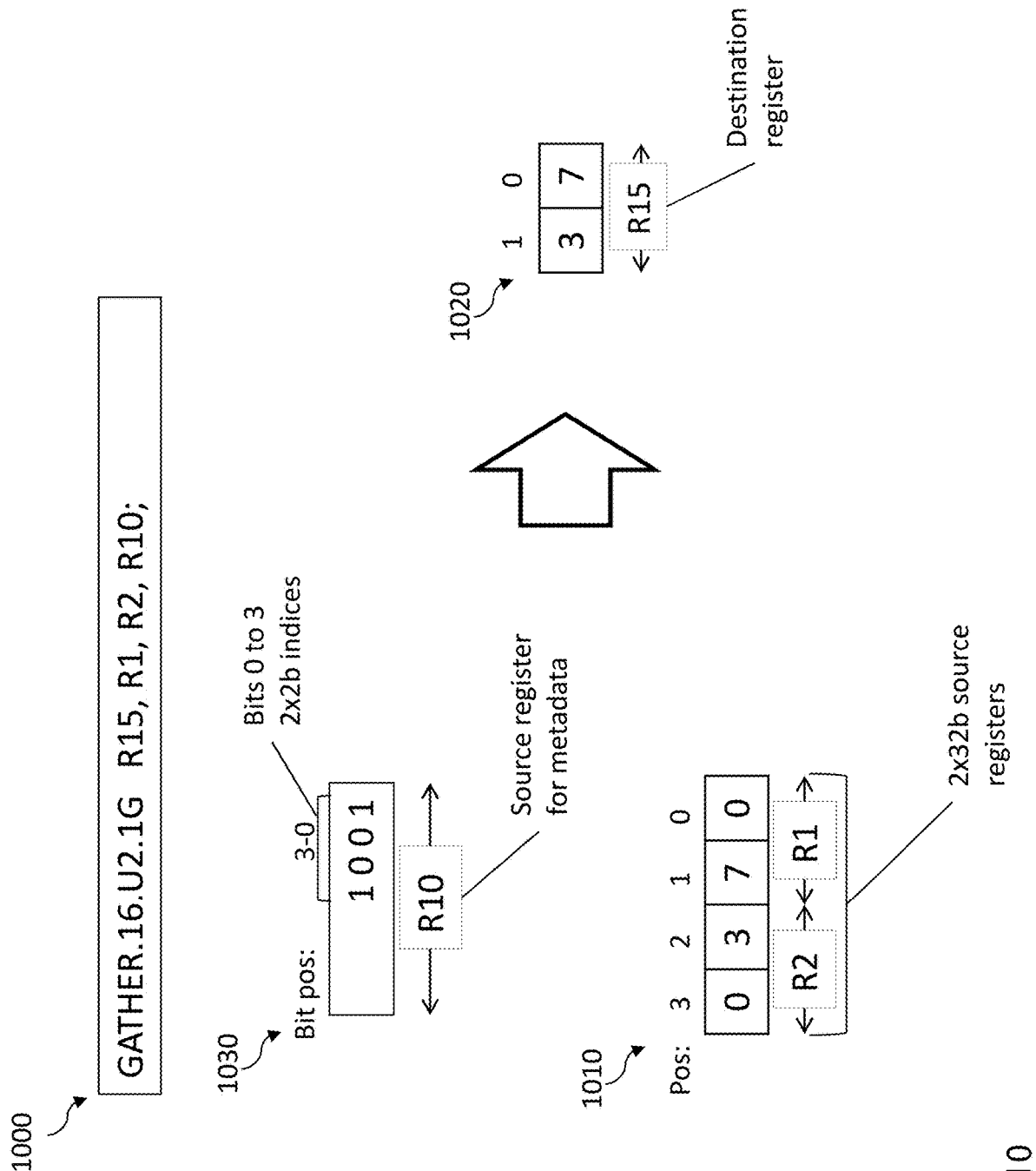
FIGS. 10-14 are examples of a GATHER instruction that compresses an N element data structure into an M element data structure according to one or more aspects of the disclosure.

FIG. 10 illustrates an example of GATHER instruction 1000 that compresses an N element data structure into an M element data structure according to metadata that has been generated using a metadata-generating instruction such as a GENMETADATA described above. In the illustrated example, N is 4 and M is 2.

In the illustrated example, one input 4 element data structure 1010 (as indicated by .1G) in first source registers R1 and R2 are compressed into one 2 element data structure in a destination register R15, according to metadata 1030 in a second source register R10. .16 indicates that each element in the input 4 element data structure 1010 is 16 bits.

As each metadata index is 2 bits (as indicted by.U2), the first 2 values 1 0 (bit positions 3 and 2 in the metadata 1030) indicate the position 2, and the next 2 values 0 1 (bit positions 1 and 0 in the metadata 1030) indicate the position 1. As such, '3' in the position 2 and '7' in the position 1 of the input data structure 1010 are gathered and written into the 2 element data structure 1020 in the destination register R15. In the illustrated example, #VecIdxU06, #MDidxU04, #DstByteU02, and #SrcHalfU01 are not specified.

Figure 11:
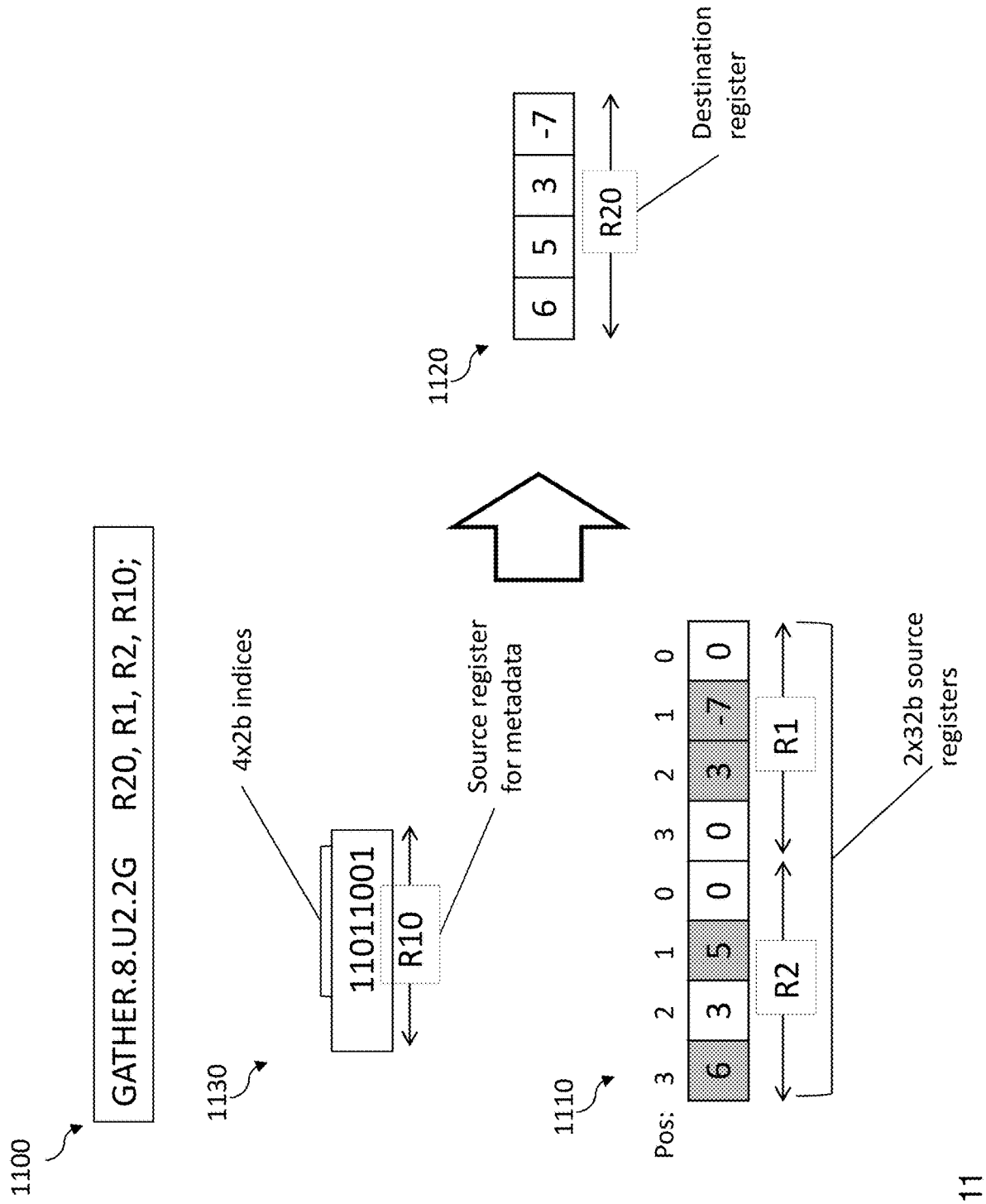

FIG. 11 illustrates another example of GATHER instruction that compresses an N element data structure into an M element data structure according to metadata that has been generated using a metadata-generating instruction such as a GENMETADATA described above. In the illustrated example, N is 4 and M is 2.

In the illustrated example, two input 4 element data structures 1110 (as indicated by .2G) in first source registers R1 and R2 are compressed into two 2 element data structures 1120 in a destination register 1120, according to metadata 1130 in a second source register R10. .8 indicates that each element in the input 4 element data structures 1110 is 8 bits.

As each metadata index is 2 bits (as indicted by.U2), the first 2 values 1 1 indicates the position 3 in R2, the next 2 values 0 1 indicate the position 1 in R2, the next 2 values 1 0 indicate the position 2 in R1, and the last two values 0 1 indicate the position 1 in R1. As such, values '6' and '5' in the positions 3 and 1 of the register R2, and '3' and '-7' in the positions 2 and 1 of the register R1 are gathered and written into the two 2 element data structures 1120 in the destination register R20. In the illustrated example, #VecIdxU06, ##MDidxU04, #DstByteU02, and #SrcHalfU01 are not specified.

Figure 12:
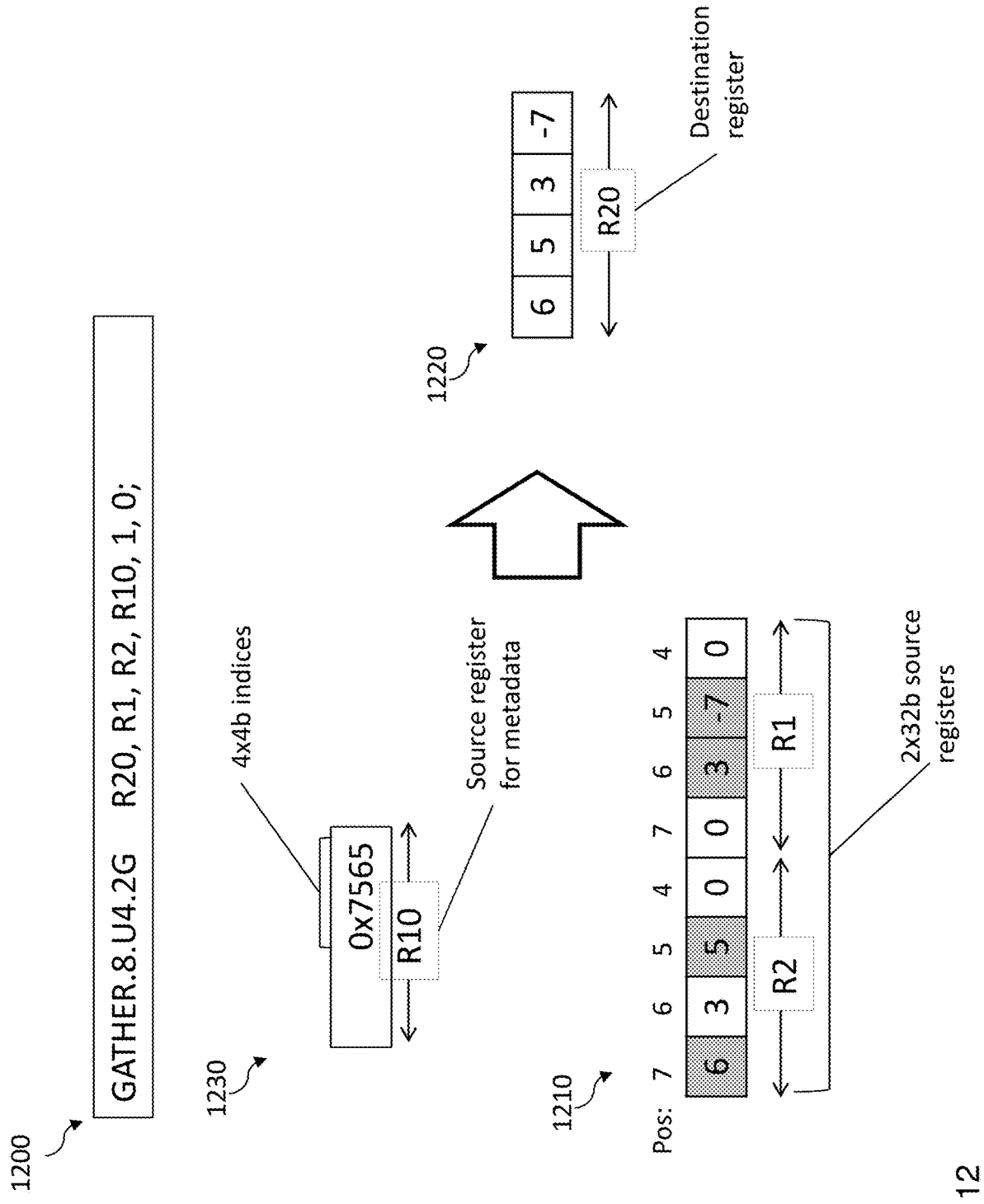

FIG. 12 illustrates another example 1200 of GATHER instruction that compresses an N element data structure into an M element data structure according to metadata that has been generated using a metadata-generating instruction such as a GENMETADATA described above. In the illustrated example, N is 4 and M is 2. In the illustrated example, two input 4 element data structures 1210 (as indicated by .2G) in first source registers R1 and R2 are compressed into two 2 element data structures 1220 in a destination register R20, according to metadata 1230 in a second source register R10. .8 indicates that each element in the input 4 element data structures 1210 is 8 bits. As #VecIdxU06 is 1, each input 4 element data structure 1210 starts at position 4 (1×4). As

MDidxU04 is zero, there is no offset for the metadata 1230 within the second source register R10.

As each metadata index is 4 bits (as indicated by .U4), the first value '7' of the metadata 1230 indicates the position 7 in R2, the second value '5' indicates the position 5 in R2, the third value '6' indicate the position 6 in R1, and the fourth value '5' indicate the position 5 in R1. As such, values '6' and '5' in the positions 7 and 5 of the register R2, and values '3' and '−7' in the positions 6 and 5 of the register file R1 are gathered and written into the two 2 element data structures 1220 in the destination register R20. In the illustrated example, #DstByteU02, and #SrcHalfU01 are not specified.

Figure 13:
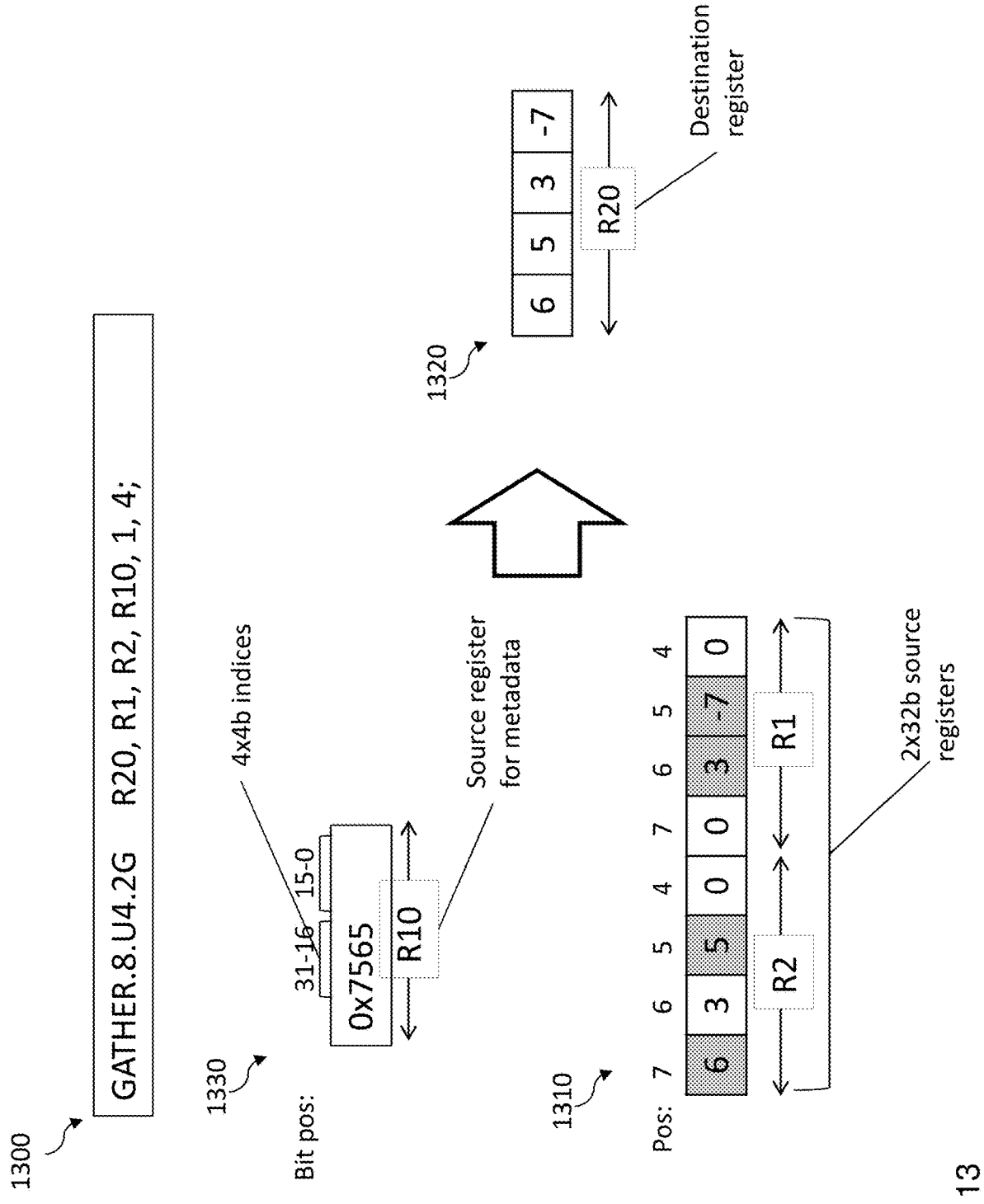

FIG. 13 illustrates another example of GATHER instruction that compresses an N element data structure into an M element data structure according to metadata that has been generated using a metadata-generating instruction such as a GENMETADATA described above. In the illustrated example, N is 4 and M is 2.

In the illustrated example, two input 4 element data structures 1310 (ad indicated by .2G) stored in the first source registers R1 and R2 are compressed into a two 2 element data structures 1320 in a destination register R20 according to metadata 1330 stored in a second source register R10. .8 indicates that each element in the input 4 element data structures 1310 is 8 bits. As #VecIdxU06 is 1, the elements in each input data structure starts at position 4 (1×4), and as both #MDidxU04 and .idxsize are 4, the starting bit for the metadata 1330 within the second source register is 16 (4×4).

As each metadata index is 4 bits (as indicated by .U4), the first two values '7' and '5' of the metadata 1330 indicates the positions 7 and 5 in R2, and the next two values '6' and '5' indicate the positions 6 and 5 in R1. As such, values '6' and '5' in the positions 7 and 5 of register R2, and values '3' and '−7' in the positions 6 and 5 of register R1 are gathered and written into the two 2 element data structures in the destination register R20. In the illustrated example, #DstByteU02, and #SrcHalfU01 are not specified.

Figure 14:
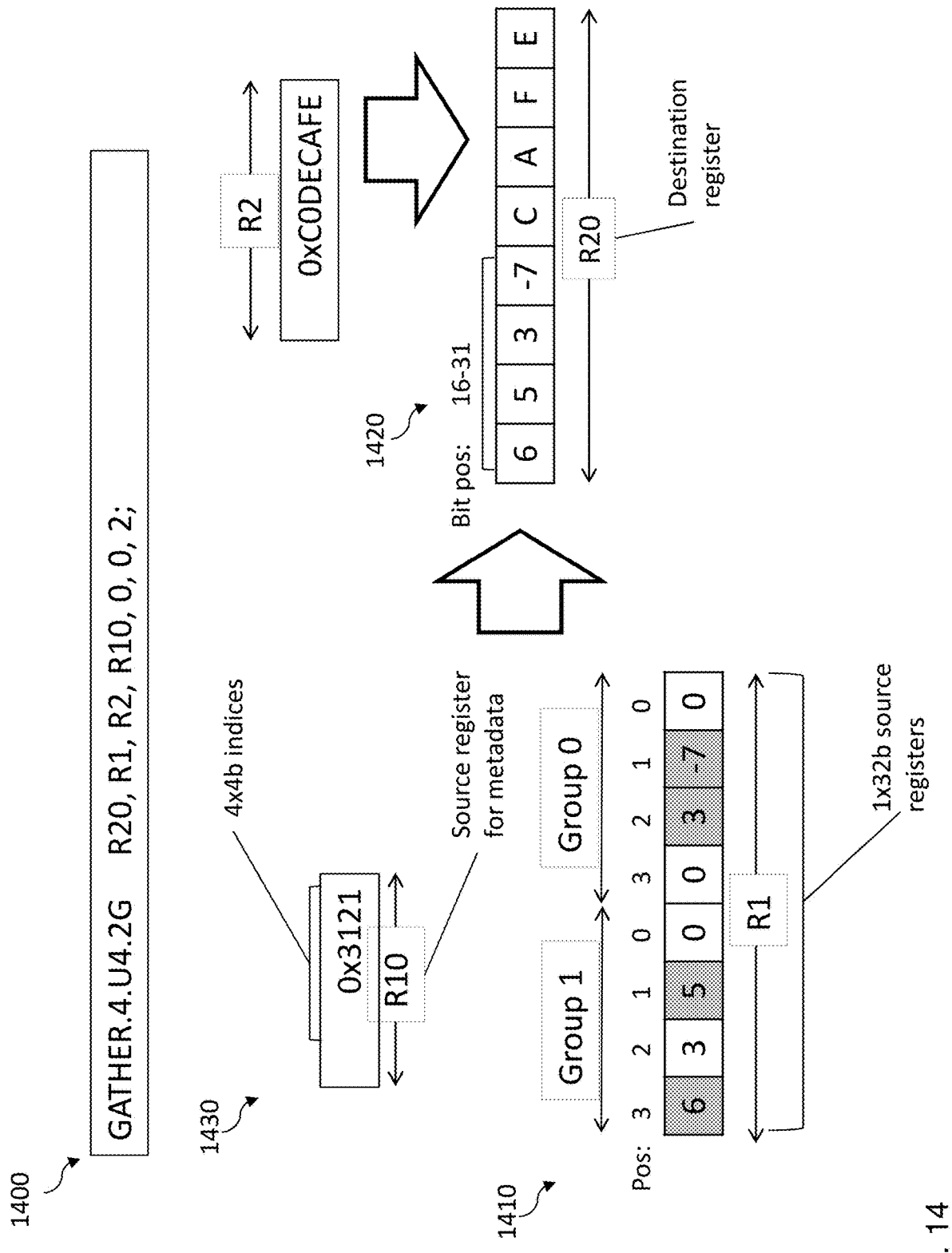

FIG. 14 illustrates another example of GATHER instruction that compresses an N element data structure into an M element data structure according to metadata that has been generated using a metadata-generating instruction such as a GENMETADATA described above. In the illustrated example, N is 4 and M is 2.

In the illustrated example, the presence of #DstByteU02 indicates that first source register R1 contains all the input data, and the gathered data is 16 bits. Also, value 2 of #DstByteU02 indicates that the gathered data would be offset by 2 bytes or 16 bits in R20, and the rest of R20 would be written with the contents of the other first source register R2. As such, two input 4 element data structures 1410 (as indicated by .2G) in the first source register R1 are compressed into two 2 element data structures 1320 in positions 16-31 of a destination register R20, according to metadata 1230 in a second source register R10. .4 indicates that each element in the input 4 element data structures 1410 is 4 bits.

As each metadata index is 4 bits, the first two values '3' and '1' indicate the positions 3 and 1 in Group 1, and the next two values '2' and '1' indicate the positions 2 and 1 of in Group 0. As such, values '6' and '5' in Group 1 and values '3' and '−7' in Group 0 are gathered and written into the two 2 element data structures in the positions 16-31 of the destination register R20. The rest of R20 is written with the contents of the other first source register R2. As the instruction 1400 deals with two groups of 4-bit elements, #SrcHalfU01 is not used.

An example format for an example of the 'super-instruction' referred as GATHERPLUS instruction is shown below.

GATHERPLUS{.rnode}.func.selectN.fmt.idxsize.num {.SEQ}Rd1,Rd2,Ra, Rb, Rc, #VecIdxU06, #MDidxU04, #DstByteU02, #SrcHalfU01 where:

.mode an optional mode indicating whether metadata ('METADATA') or compressed data ('DATA') is produced; when absent, both metadata and compressed data are produced;

.func: a function that controls how values of elements in an N element data structure are compared to one another for selection (as described above, .func can be, for example, MAX, ABSMAX, MIN, ABSMIN, etc.);

.selectN: a number of elements to be selected using .func such as 1 or 2;

.fmt: a format of elements in Ra and Rb, including integer formats such as signed 2, 4, 8, 16 and 32 bit integer (.S2, .S4, .S8, .S16, .S32) and unsigned 2, 4, 8, 16 and 32 bit integer (.U2, .U4, .U8, .U16, .U32) and non-integer formats such as IEEE half precision (16 bits) or single (32 bits) precision floating point (.FP16, .FP32), truncated versions of FP16 and FP32 (E8M7, E8M10), LNS (log number system), POSITs (a proposed new dynamical scaled numeric format), other 8-bit floating point like formats, and Block-exponent formats;

.idxsize: a size of metadata index such as 2-bit, 4-bit, or 8 bit (.U2, .U4, .U8)

.num: a number of input N element data structures in in the source storage such as 1 data structure, 2 data structures, or 4 data structures (.1G, .2G, .4G);

.SEQ: optional sequential indexing: when operating on more than one N element data structure, all N element data structures are sequentially indexed as though they are part of a single, larger data structure instead of repeating the same N indices for each N element data structure;

Rd1: first destination register or memory location;

Rd1: second destination register or memory location;

Ra: first source register or memory location containing all or a portion of an N element data structure;

Rb: second source register or memory location containing all or a portion of an N element data structure;

Rc: optional source register or memory location; when GENMETADATA specifies .idxsize and .num such that that not all bits of Rd1 or 2 would be written, the contents of Rc flow through to otherwise unwritten bits of Rd1 or 2;

VecIdxU06: group index; 6 bit immediate indicating the (starting) position of an N element data structure within a larger data structure, e.g., when the N element data structure is one of multiple N element data structures in the larger data structure.

MDidxU04: metadata index; 4-bit immediate that determines the offset in bits where metadata is located within Rc;

DstByteU02: 2-bit immediate used to determine where in Rd to write the 16-bit or 8-bit word when total input data is 32 or 16 bits, respectively (1 group of int8, 2 groups of int4, or 1 group of int4). When the total input data is 32 bits, then this immediate must have a value that is a multiple of 2. When this immediate has a value that is a multiple of 2, Ra alone contains all the input data, the gathered data elements are either 16 or 8 bits, and only a portion of Rd is written with this data; the rest of Rd is written with the contents of Rb;

SrcHalfU01: 1-bit immediate used to determine whether to read from the lower or upper half of Ra when operating on a single group of int4 data elements.

As mentioned above, the super-instruction is a combination of a metadata-generation instruction, e.g., a GENMETADATA, and a data compression instruction, e.g., GATHER. The super-instruction includes all the common fields/parameters of the combined instructions and two registers/memory locations for the metadata and the compressed data.

One main difference between the super instruction and the two separate instructions described above is that the super instruction produces, e.g., writes, two sets of output, the metadata and the compressed data. These two sets of output may be produced, for example, 1) in parallel and/or 2) in sequence. When produced in parallel, the super instruction can write to two different registers/memory locations at the same time. When produced in sequence, the super instruction can write to one place at a time so the operations, metadata-generation and data compression, are performed one after another. This implies the instruction has internal state.

Figure 15:
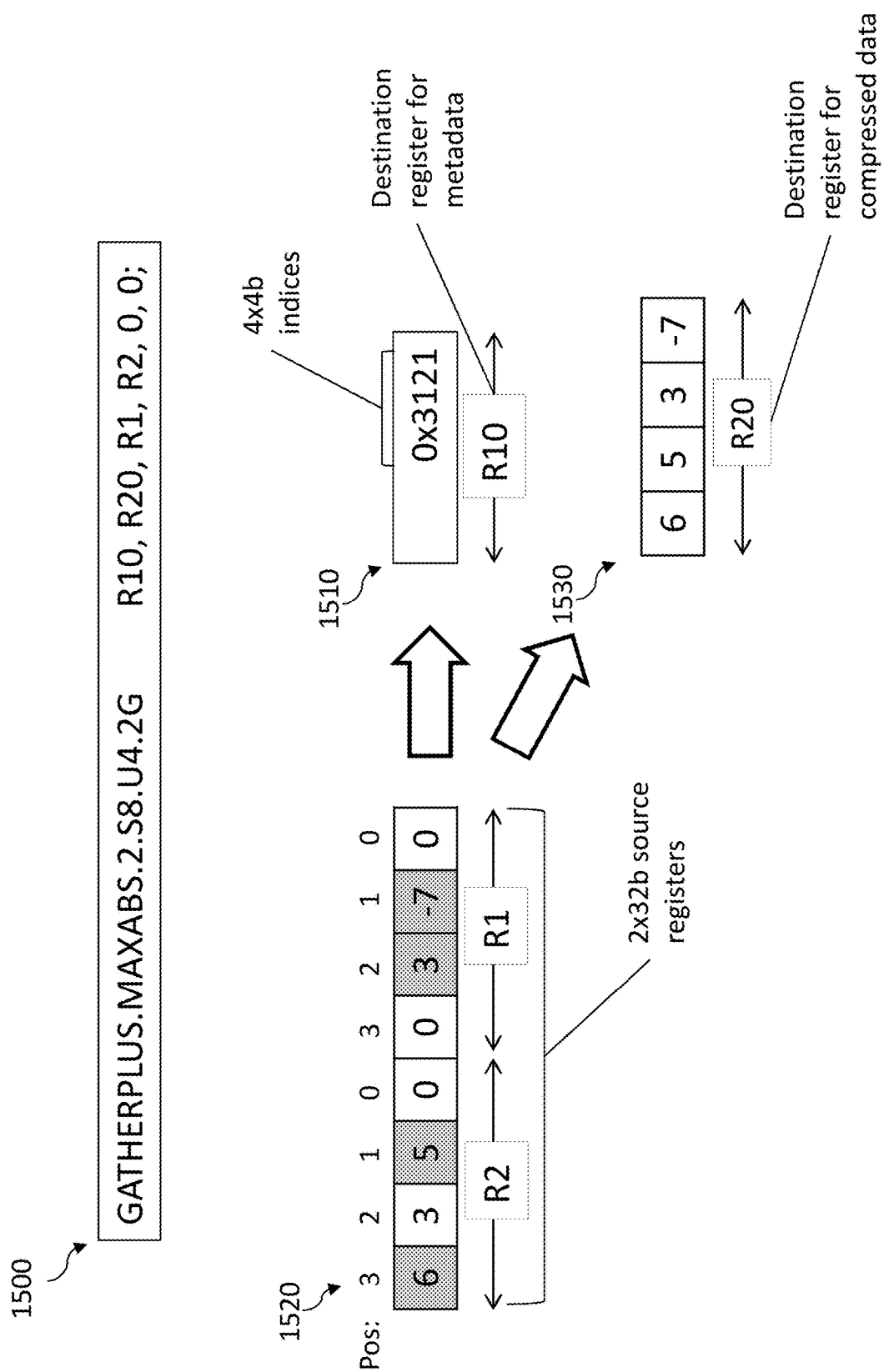
FIG. 15 is an example of a GATHERPLUS instruction that generates metadata and compresses an N element data structure into an M element data structure according to one or more aspects of the disclosure

FIG. 15 illustrates an example of GATHERPLUS instruction 1300 that generates metadata from an N element data structure and compresses the N element data structure into an M element data structure. In the illustrated example, N is 4 and M is 2.

In a first operation of the instruction 1300, positions of two elements from each of two input 4 element data structures 1520 (as indicated by .2G) in source registers R1 and R2 are written to metadata 1510 in a first destination register R10. More specifically, during the first operation of the instruction 1500, positions of two elements with greater magnitude (as indicated by MAXABS.2) from each of the two input 4 element data structures 1520 in source registers R1 and R2, i.e. positions '3' and '1' of elements having values '6' and '5' in R2 and positions '2' and '1' of elements having values '3' and '−7' in R1, are written to the metadata 1510 in the first destination register R10.

In a second other operation of the instruction 1300, the values of the two elements with the greater magnitude from each of the two input 4 element data structures 1320, i.e. values '6' and '5' of the elements in R2 and the values '3' and '−7' of the elements in R1, are gathered and written into a two 2 element data structures 1330 in a second destination register R20. These two operations can be carried out in parallel or in sequence. Although both #VecIdxU06 and #MDidxU04 are zero in the illustrated example, they can be set to indicate the offsets in the respective registers/memory locations similar to GENMETADATA and GATHER instructions.

As such, the positions '3' and '1' of elements having values of '6' and '5' in R2 and the positions '2' and '1' of elements having values of '3' and '−7' in R1 are written to the first 16 bits (4×4 bits) of the metadata 1310 in the first destination register R10. Also the values '6' and '5' of the elements in R2 and the values '3' and '−7' of the elements in R1 are gathered and written into the two 2 element data structures 1330 in the second destination register R20.

Figure 16:
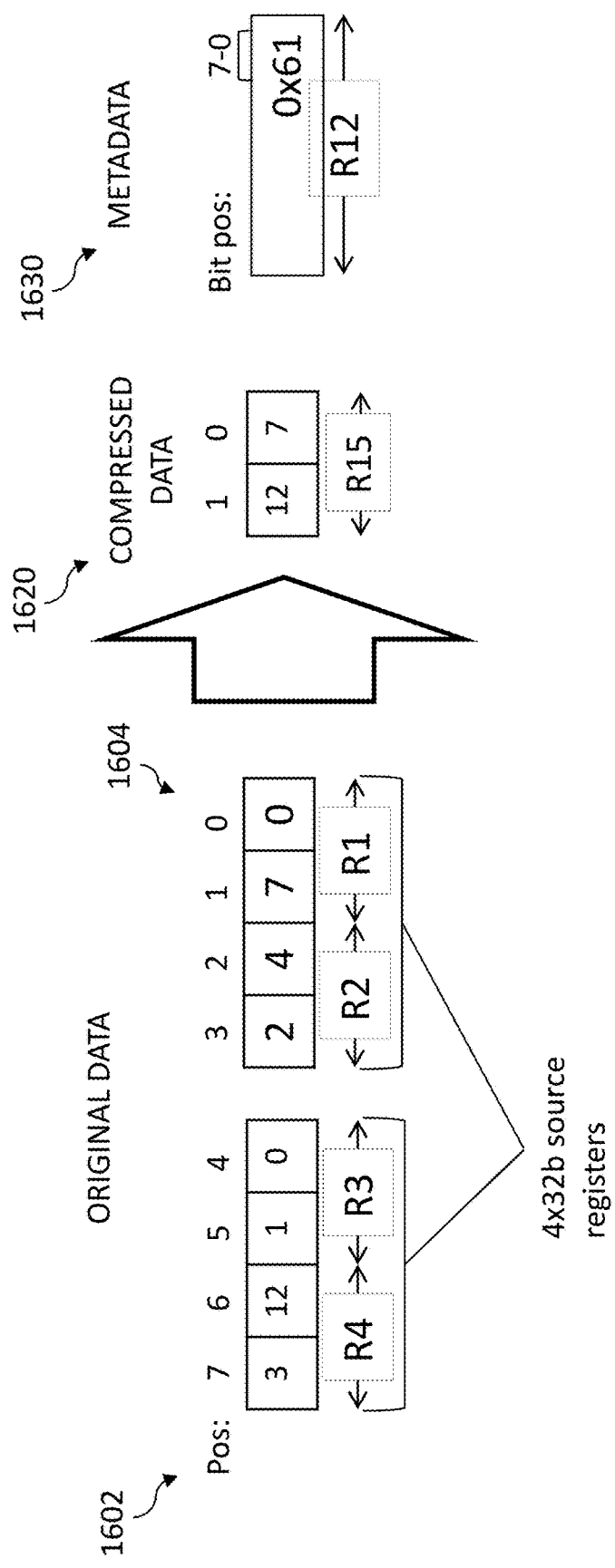
FIGS. 16-21 are examples of GENMETADATA and GATHER instructions that are cascaded to achieve a 2:8 compression ratio according to one or more aspects of the disclosure.

FIGS. 16-21 illustrate an example of a cascade of GENMETADATA and GATHER instructions that achieve a 2:8 sparsity/compression ratio. As indicated in FIG. 16, the illustrated example compresses original data, which consists of two 4 element data structures 1602 and 1604, into compressed data, one 2 element data structure 1620 that has two elements with values '12' and '7'. The 2-element data structure 1620 would have metadata 1630.

Figure 17:
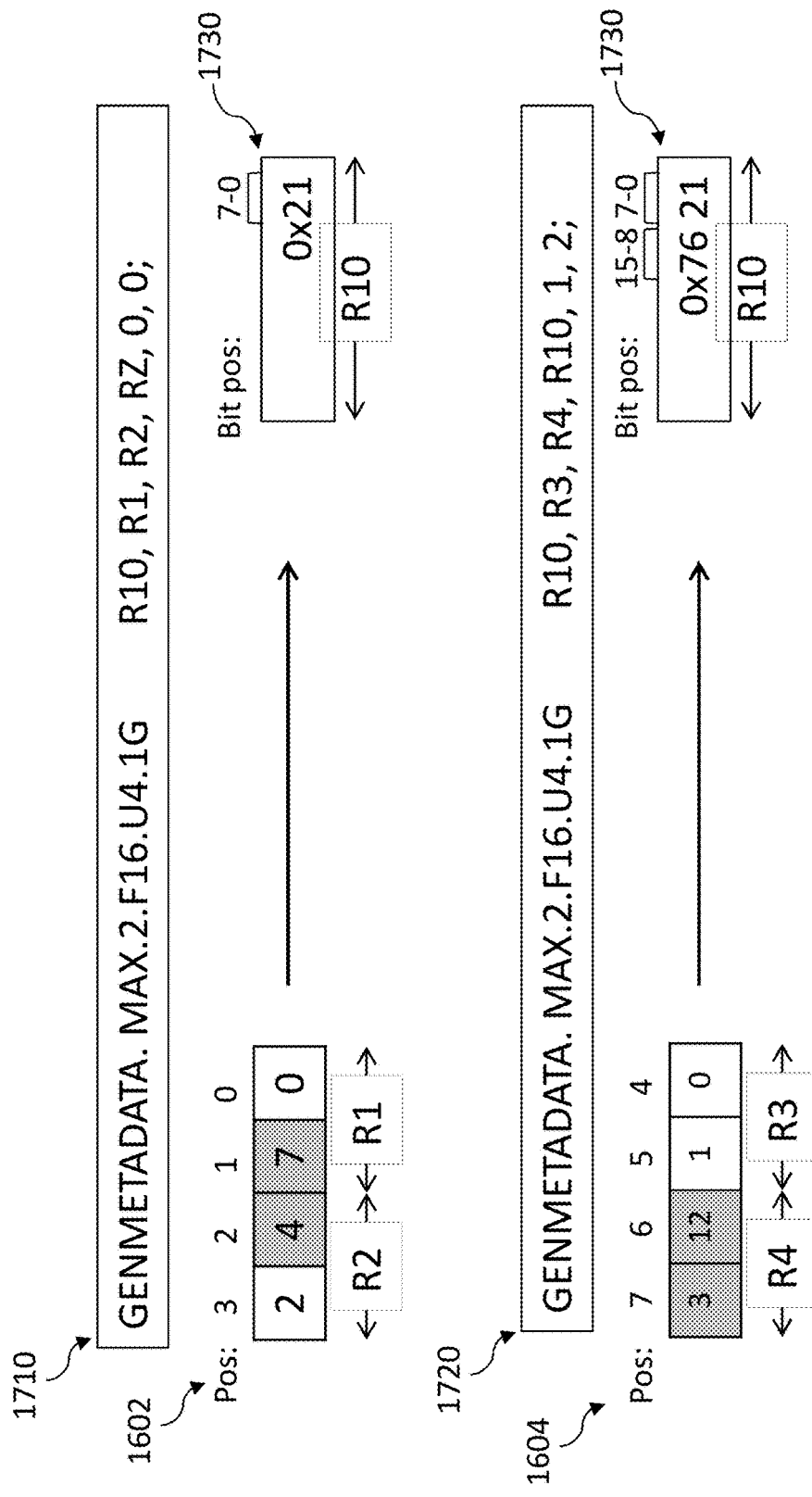

In FIG. 17, metadata 1730 is produced from the two input 4 element data structures 1602, 1604. First, using the first GENMETADATA instruction 1710, positions of elements with greater values in the first input data structure 1602 are determined and written into the metadata 1730. As the value of both #VecIdxU06 and #MDidxU04 are zero in the first GENMETADATA instruction 1710, positions '2' and '1' of the elements with greater values in the first input data structure 1602, which starts at bit 0 (of a larger data structure), are stored at bits 0-7 of the metadata 1730. Second, using the second GENMETADATA instruction 1720, positions of elements with greater values in the second input data structure 1604 are determined and written into the metadata 1730. In the second GENMETADATA instruction, values of #VecIdxU06 and #MDidxU04 are set to '1' and '2', respectively. As such, positions '7' and '6' of the elements with greater values in the second input data structure 1604, which starts at bit 4, are stored at bits 8-15 of the metadata 1730.

Figure 18:
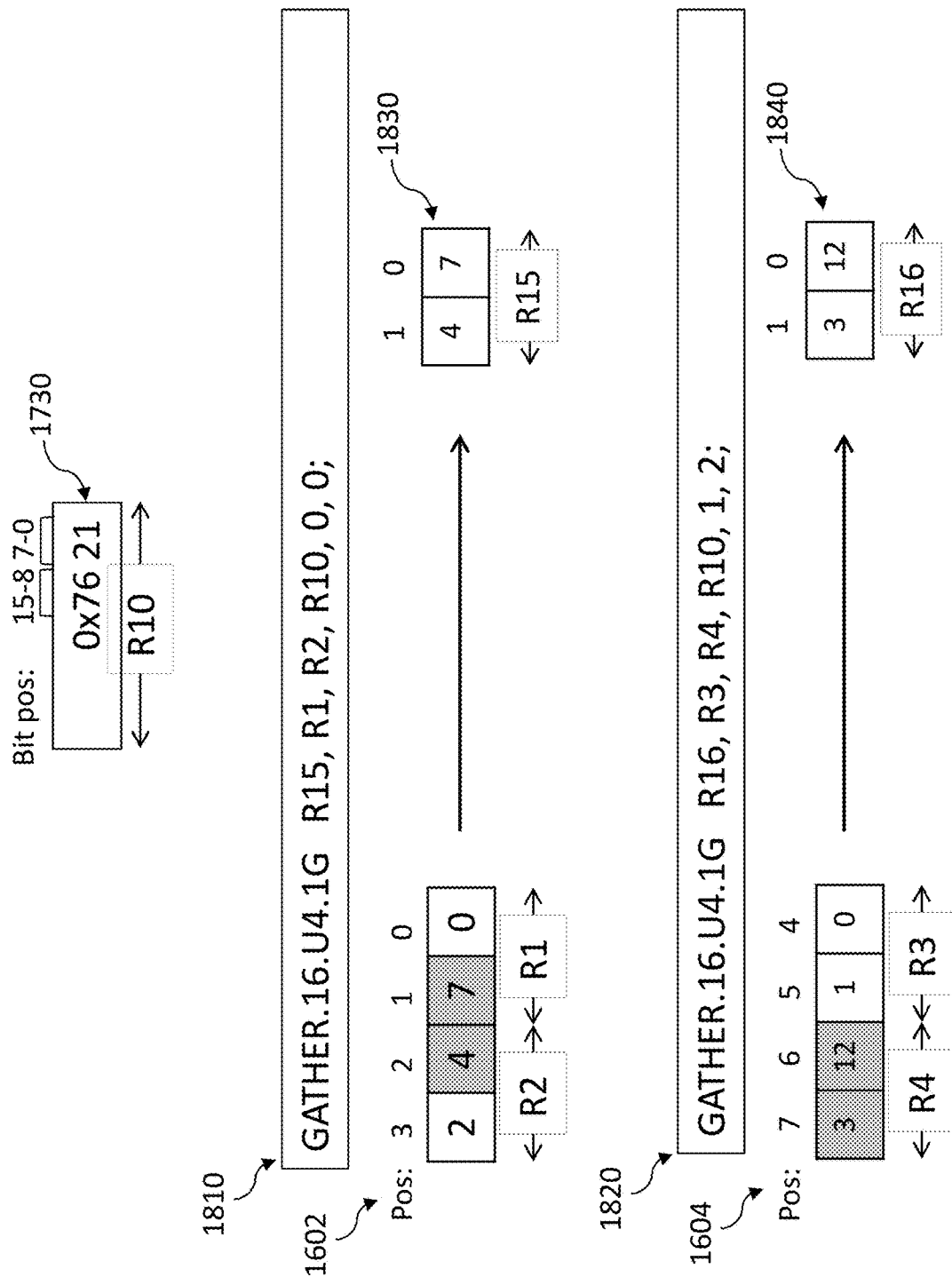

In FIG. 18, values of the elements with greater values in the input data structures 1602, 1604 are gathered into two 2-element data structures 1830, 1840 using the metadata 1730. First, using a first GATHER instruction 1810, values of the elements with greater values in the first input data structure 1602 are gathered into a first 2-element data structure 1830. As the values of both #VecIdxU06 and #MDidxU04 are zero in the first GATHER instruction 1810, the values '2' and '1' are gathered from the first input data structure 1602, which starts at the position 0 (of the larger data structure), using the positions '2' and '1' at bits 0-7 of the metadata 1730. Second, using a second GATHER instruction 1320, values of the elements with greater values in the second input data structure 1604 are gathered into a second 2-element data structure 1840. In the second GATHER instruction 1820, values of #VecIdxU06 and #MDidxU04 are set to '1' and '2', respectively. As such, values '7' and '6' are gathered from the second input data structure 1604, which starts at position 4 (of the larger data structure) using the positions '7' and '6' at bits 8-15 of the metadata 1730.

Figure 19:
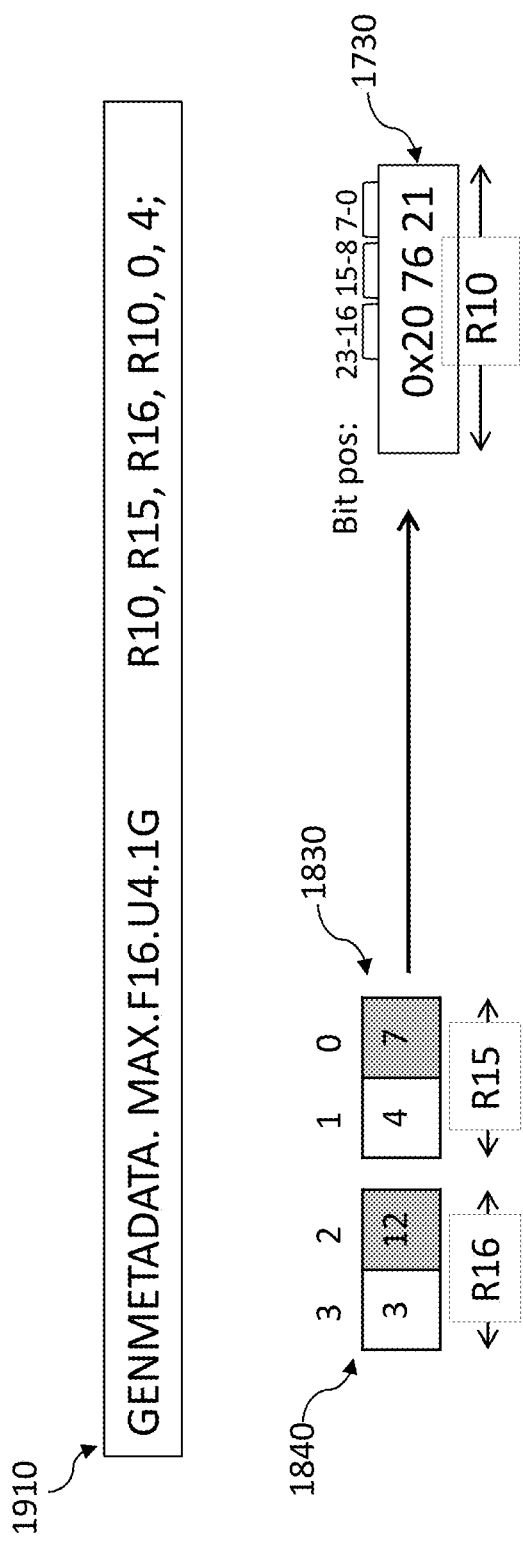

In FIG. 19, positions of elements with greater values in the two 2-element data structures 1830, 1840 are determined and written into the metadata 1730 by executing another GENMETADATA instruction 1910. As value of #MDidxU04 is '4', positions '2' and '1' of elements with values of '12' and '7' are offset 16 bits and written into bits 16-23 of the metadata 1730.

Figure 20:
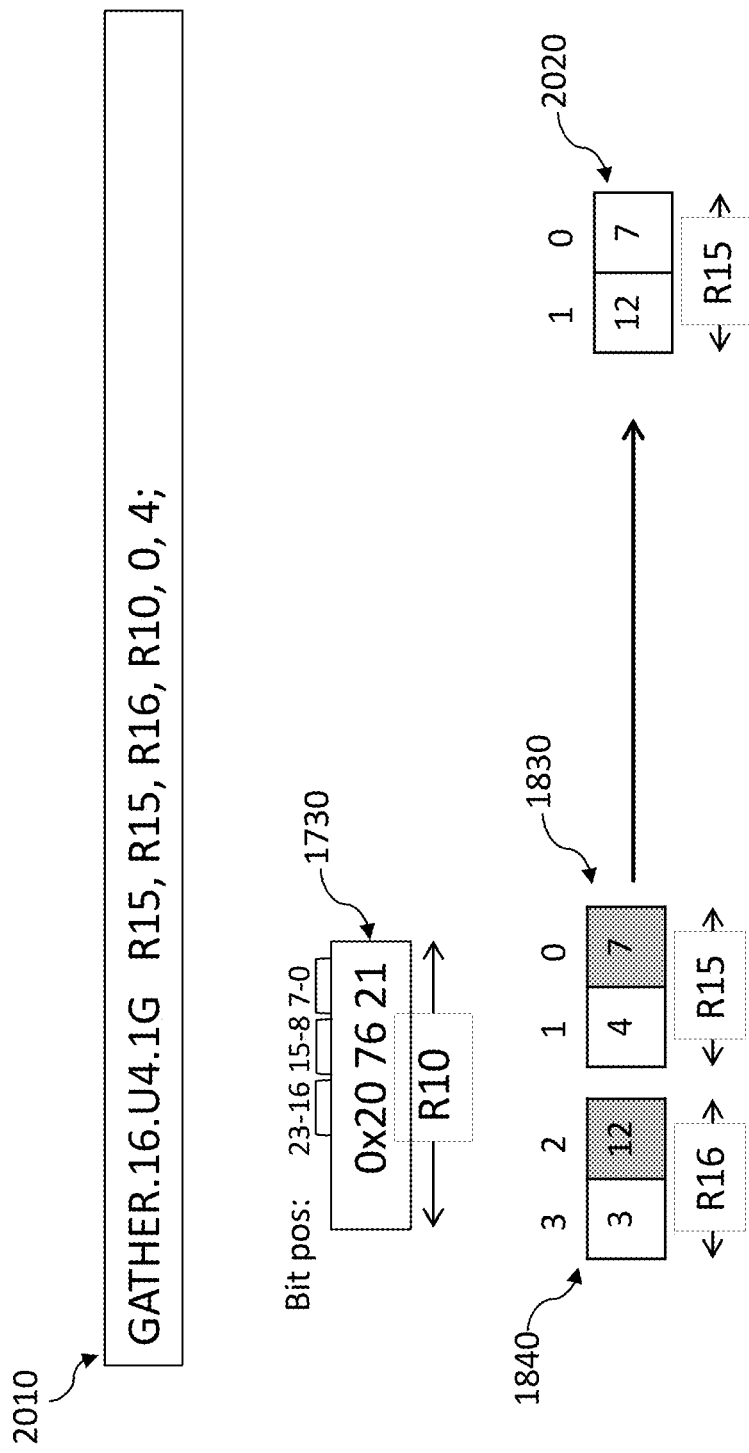

In FIG. 20, values of the elements with greater values in the two 2-element data structure 1830, 1840 are gathered and written into a 2-element data structure 2020 by executing another GATHER instruction 2010. Value of #MDidxU04 is set to '4' such that positions '2' and '0' at bits 16-23 of the metadata 1730 are used to gather the values '12' and '7' of the corresponding elements. The 2-element data structure 2020 is identical to the final compressed data, the 2-element data structure 1620 in FIG. 16.

Figure 21:
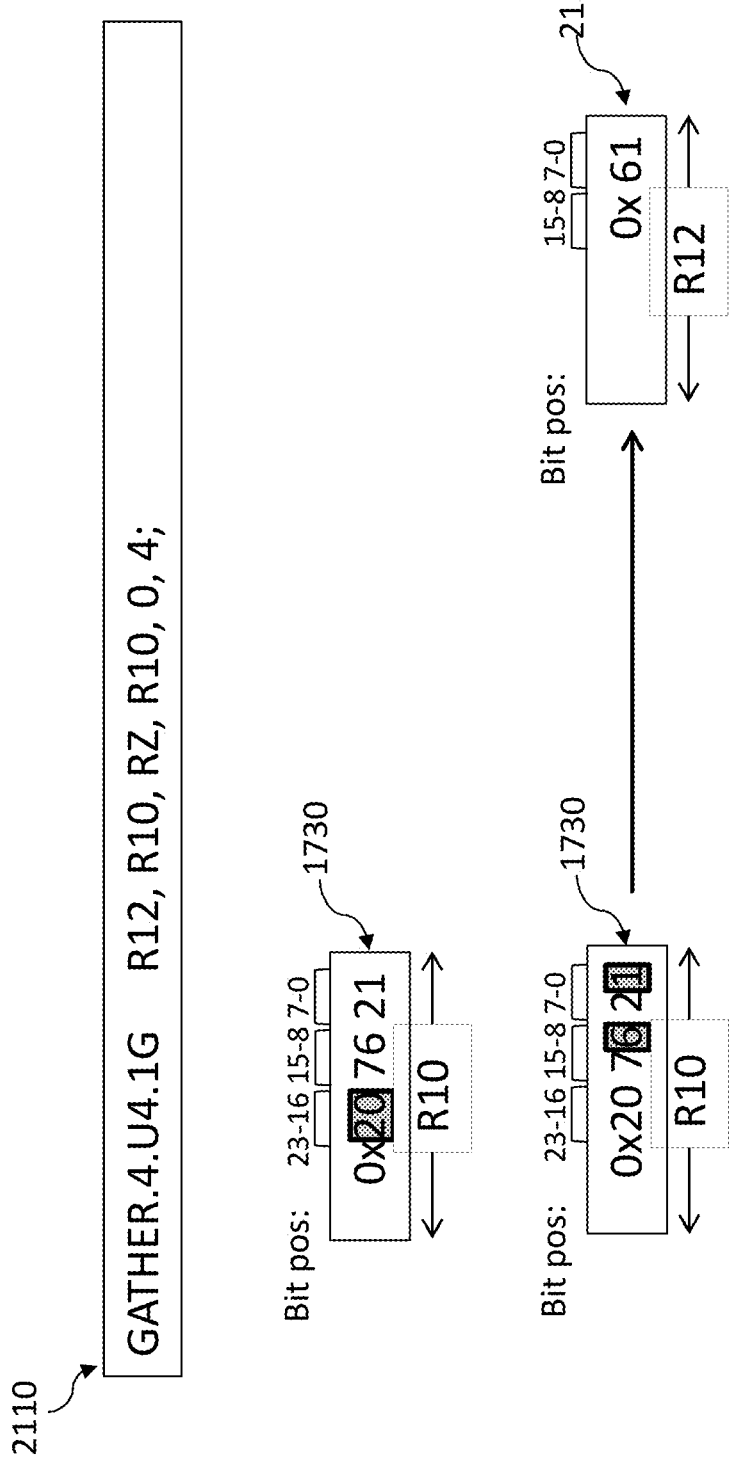

In FIG. 21, the metadata 1730 is treated as both an input data structure and metadata for another GATHER instruction 2110. As value of #MDidxU04 is '4', positions at bits 16-23 of the metadata 1730 are used to gather the values of the corresponding elements. As a result, the GATHER instruction 2110 produces a data structure 2120 that is identical to the final metadata 1630 in FIG. 16. It is understood that the instructions shown in FIGS. 15-21 can be repeated as needed to achieve higher degrees of sparsity. For example, repeating a metadata generation followed by a compression for four 4-element data structures until there are 2 elements left (FIGS. 17-20), and then generating the final metadata for the remaining 2 elements can to create 2:16 sparsity/compression ratio.

It is understood that each GENMETADATA and GATHER instructions in the illustrated example may be replaced with a super-instruction such as GATHERPLUS by setting the optional mode parameter to match the data being produced. For example, to replace a GENMETADATA instruction, a GATHERPLUS instruction will have the mode parameter set as 'METADATA', and to replace a GATHER instruction, the GATHERPLUS instruction will have the mode parameter set as 'DATA.'

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

What is claimed is:

1. A method for compressing data, comprising:
    generating metadata from an N element data structure, said generating including:
        selecting M elements from said N element data structure, wherein N is greater than M;
        determining positions of said M elements within said N element data structure; and
        storing said positions of said M elements as said metadata; and
    compressing said N element data structure to an M element data structure according to said metadata, said compressing includes:
        gathering values of said M elements from said N element data structure according to said positions; and
        storing said values of said M elements in said M element data structures wherein:
        said generating is carried out using a first instruction; and
        said generating includes receiving, as an input of said first instruction, said N element data structure.

2. The method of claim 1, wherein said generating includes determining a starting position of said N element data structure within a larger data structure using a group index in said first instruction.

3. The method of claim 1, wherein said generating further includes determining a starting position of said metadata within a destination register using a metadata index in said first instruction.

4. The method of claim 1, wherein said first instruction is a GENMETADATA instruction.

5. The method of claim 1, wherein said selecting is based on a function in said first instruction that compares values of N elements in said N element data structure to one another.

6. The method of claim 5, wherein said function is a MAX function or a MAXABS function.

7. The method of claim 1, wherein said compressing is carried out using a second instruction.

8. The method of claim 7, wherein said compressing includes determining a starting position of said N element data structure within a larger data structure using a group index in said second instruction.

9. The method of claim 7, wherein said compressing includes determining a starting position of said metadata within a source register using a metadata index in said second instruction.

10. The method of claim 7, wherein said compressing includes receiving, as an input of said second instruction, said metadata and said N element data structure.

11. The method of claim 7, wherein said second instruction is a GATHER instruction.

12. The method of claim 1, wherein:
    said N element data structure is a N element vector, and said M element data structure is a M element vector; or
    said N element data structure is a N element tensor, and said M element data structure is a M element tensor.

13. The method of claim 1, wherein M is 2, and N is 4.

14. The method of claim 1, further comprising repeating said generating and said compressing to compress said N element data structure to a P-element data structure, P being smaller than M.

15. The method of claim 1, wherein said generating and said compressing are carried out using a single instruction.

16. A system for compressing data comprising:
a memory; and
at least one processor communicatively coupled to said memory, said at least one processor configured to:
generate metadata from an N element data structure by:
selecting M elements from said N element data structure, wherein N is greater than M;
determining positions of said M elements within said N element data structure; and
storing said positions of said M elements as said metadata; and
compress said N element data structure to an M element data structure according to said metadata by:
gathering values of said M elements from said N element data structure according to said positions; and
storing said values of said M elements in said M element data structures wherein:
said at least one processor is configured to generate said metadata by executing a first instruction; and
said at least one processor is further configured to receive, as an input of the first instruction, said N element data structure.

17. The system of claim 16, wherein said first instruction is a GENMETADATA instruction.

18. The system of claim 16, wherein said storing said positions includes determining a starting position of said metadata within a destination register using a metadata index in said first instruction.

19. The system of claim 16, wherein said determining includes determining a starting position of said N element data structure within a larger data structure using a group index in said first instruction.

20. The system of claim 16, wherein said selecting is based on a function in said first instruction that compares values of N elements in said N element data structure to one another.

21. The system of claim 20, wherein said function is a MIN function or a MINABS function.

22. The system of claim 16, wherein said at least one processor is configured to compress said N element data structure by executing a second instruction.

23. The system of claim 22, wherein said gathering includes determining a starting position of said N element data structure within a larger data structure using a group index in said second instruction.

24. The system of claim 22, wherein said gathering includes determining a starting position of said metadata within a source register using a metadata index in said second instruction.

25. The system of claim 22, wherein said at least one processor is further configured to receive, as an input of said second instruction, said metadata and said N element data structure.

26. The system of claim 22, wherein said second instruction is a GATHER instruction.

27. The system of claim 16, wherein M is 2, and N is 4.

28. The system of claim 16, wherein:
said N element data structure is a N element vector, and said M element data structure is a M element vector; or
said N element data structure is a N element tensor, and said M element data structure is a M element tensor.

* * * * *

UNITED STATES PATENT AND TRADEMARK OFFICE
CERTIFICATE OF CORRECTION

| | |
|---|---|
| PATENT NO. | : 11,489,541 B2 |
| APPLICATION NO. | : 16/426303 |
| DATED | : November 1, 2022 |
| INVENTOR(S) | : Jorge Albericio Latorre and Ming Y. Siu |

It is certified that error appears in the above-identified patent and that said Letters Patent is hereby corrected as shown below:

In the Specification

In Column 6, Line 23, after --GENMETADATA.func.selectN.-- delete "fmi." and insert --fmt.--

Signed and Sealed this
Twenty-first Day of March, 2023

Katherine Kelly Vidal
*Director of the United States Patent and Trademark Office*